(12) United States Patent
You et al.

(10) Patent No.: US 12,051,738 B2
(45) Date of Patent: Jul. 30, 2024

(54) ISOLATION STRUCTURES OF SEMICONDUCTOR DEVICES

(71) Applicant: Taiwan Semiconductor Manufacturing Co., Ltd., Hsinchu (TW)

(72) Inventors: Jia-Chuan You, Dayuan Township (TW); Chih-Hao Wang, Baoshan Township (TW); Shi Ning Ju, Hsinchu (TW); Kuo-Cheng Chiang, Zhubei (TW); Li-Yang Chuang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/666,241

(22) Filed: Feb. 7, 2022

(65) Prior Publication Data

US 2022/0165868 A1    May 26, 2022

Related U.S. Application Data

(63) Continuation of application No. 16/776,540, filed on Jan. 30, 2020, now Pat. No. 11,245,028.

(51) Int. Cl.
*H01L 29/66* (2006.01)
*H01L 27/088* (2006.01)
*H01L 29/06* (2006.01)
*H01L 29/165* (2006.01)

(52) U.S. Cl.
CPC .... *H01L 29/66795* (2013.01); *H01L 27/0886* (2013.01); *H01L 29/0649* (2013.01); *H01L 29/165* (2013.01)

(58) Field of Classification Search
CPC .......... H01L 29/66795; H01L 29/0649; H01L 29/165; H01L 29/78696; H01L 29/66439; H01L 29/42392; H01L 27/0886; H01L 27/0924; H01L 21/823431; H01L 21/823481; H01L 21/823821; H01L 21/823878
See application file for complete search history.

(56) References Cited

U.S. PATENT DOCUMENTS

| | | | |
|---|---|---|---|
| 9,093,530 B2 * | 7/2015 | Huang | ............... H01L 29/6681 |
| 9,171,929 B2 | 10/2015 | Lee et al. | |
| 9,214,555 B2 | 12/2015 | Oxland et al. | |
| 9,236,267 B2 | 1/2016 | De et al. | |
| 9,331,074 B1 | 5/2016 | Chang et al. | |
| 9,520,482 B1 | 12/2016 | Chang et al. | |
| 9,548,303 B2 | 1/2017 | Lee et al. | |
| 9,559,205 B2 | 1/2017 | Chang et al. | |

(Continued)

*Primary Examiner* — Dao H Nguyen
(74) *Attorney, Agent, or Firm* — Sterne, Kessler, Goldstein & Fox P.L.L.C.

(57) ABSTRACT

The present disclosure describes a semiconductor structure and a method for forming the same. The semiconductor structure can include a substrate, a first vertical structure and a second vertical structure formed over the substrate, and an isolation structure between the first and second vertical structures. The isolation structure can include a center region and footing regions formed on opposite sides of the center region. Each of the footing regions can be tapered towards the center region from a first end of the each footing region to a second end of the each footing region.

20 Claims, 24 Drawing Sheets

(56) References Cited

U.S. PATENT DOCUMENTS

| | | | |
|---|---|---|---|
| 9,564,353 B2* | 2/2017 | Huang | H01L 21/762 |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 10,396,205 B2* | 8/2019 | Kim | H01L 27/1203 |
| 2015/0228647 A1 | 8/2015 | Chang et al. | |
| 2016/0276340 A1 | 9/2016 | Chang et al. | |
| 2018/0366465 A1* | 12/2018 | Ching | H01L 29/161 |
| 2020/0027986 A1* | 1/2020 | Sung | H01L 29/66795 |

* cited by examiner

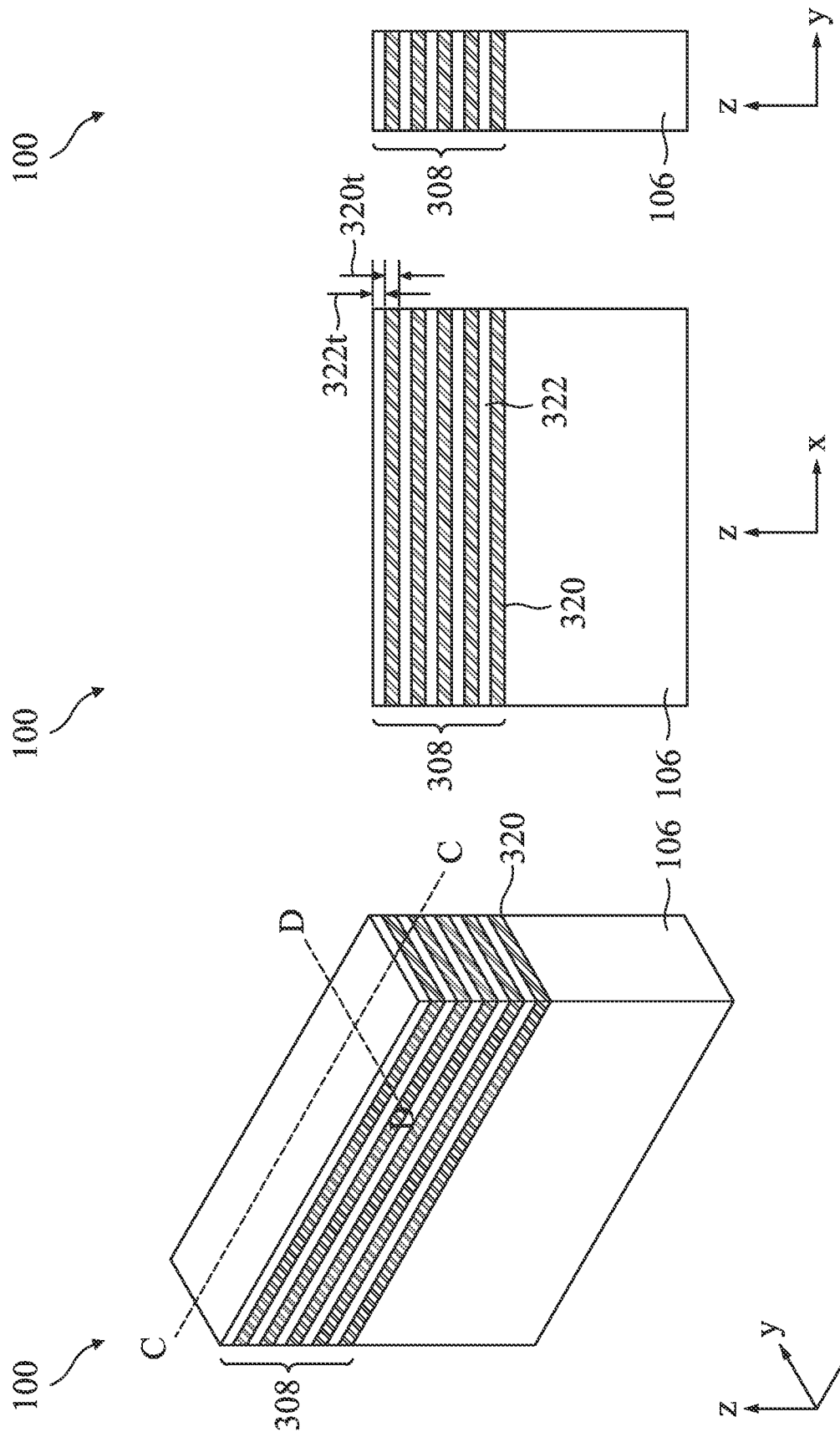

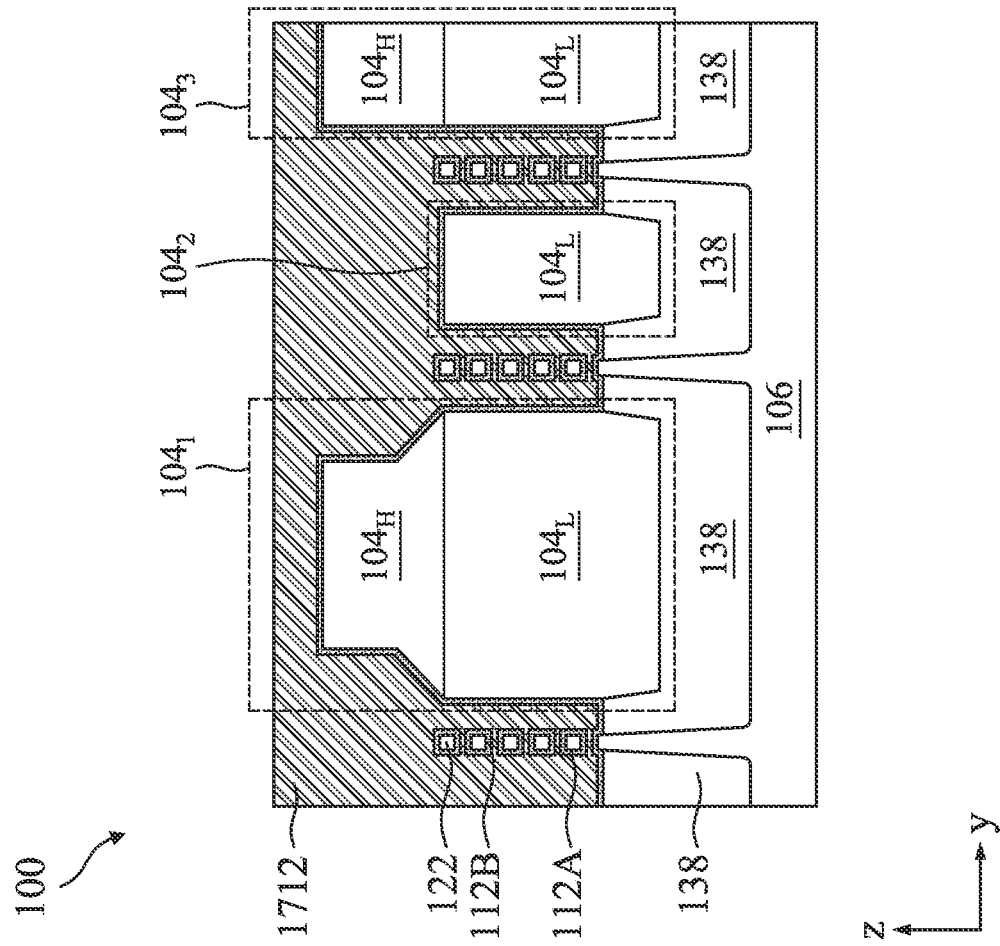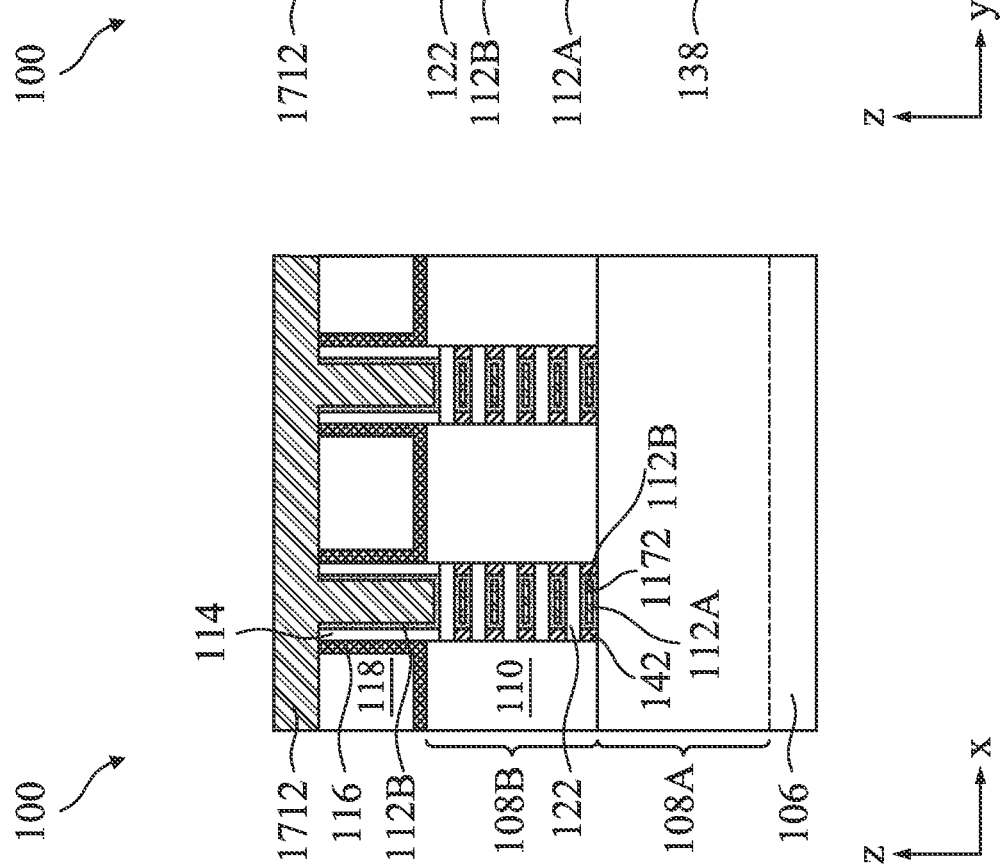
FIG. 17A
FIG. 17B

ISOLATION STRUCTURES OF SEMICONDUCTOR DEVICES

CROSS-REFERENCE TO RELATED APPLICATION

This application is a continuation of U.S. Non-Provisional patent application Ser. No. 16/776,540, filed on Jan. 30, 2020, titled "Isolation Structures of Semiconductor Devices," the disclosure of which is incorporated by reference herein in its entirety.

BACKGROUND

Advances in semiconductor technology have increased the demand for semiconductor devices with higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and nano-sheet field effect transistors (NSFETs). Such scaling down has increased the complexity of semiconductor device manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 3A-3C and 4A-4C illustrate isometric views of a semiconductor device at various stages of its fabrication process, according to some embodiments.

FIGS. 17A-17B and 18A-18B illustrate cross-sectional views of a semiconductor device at various stages of its fabrication process, according to some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
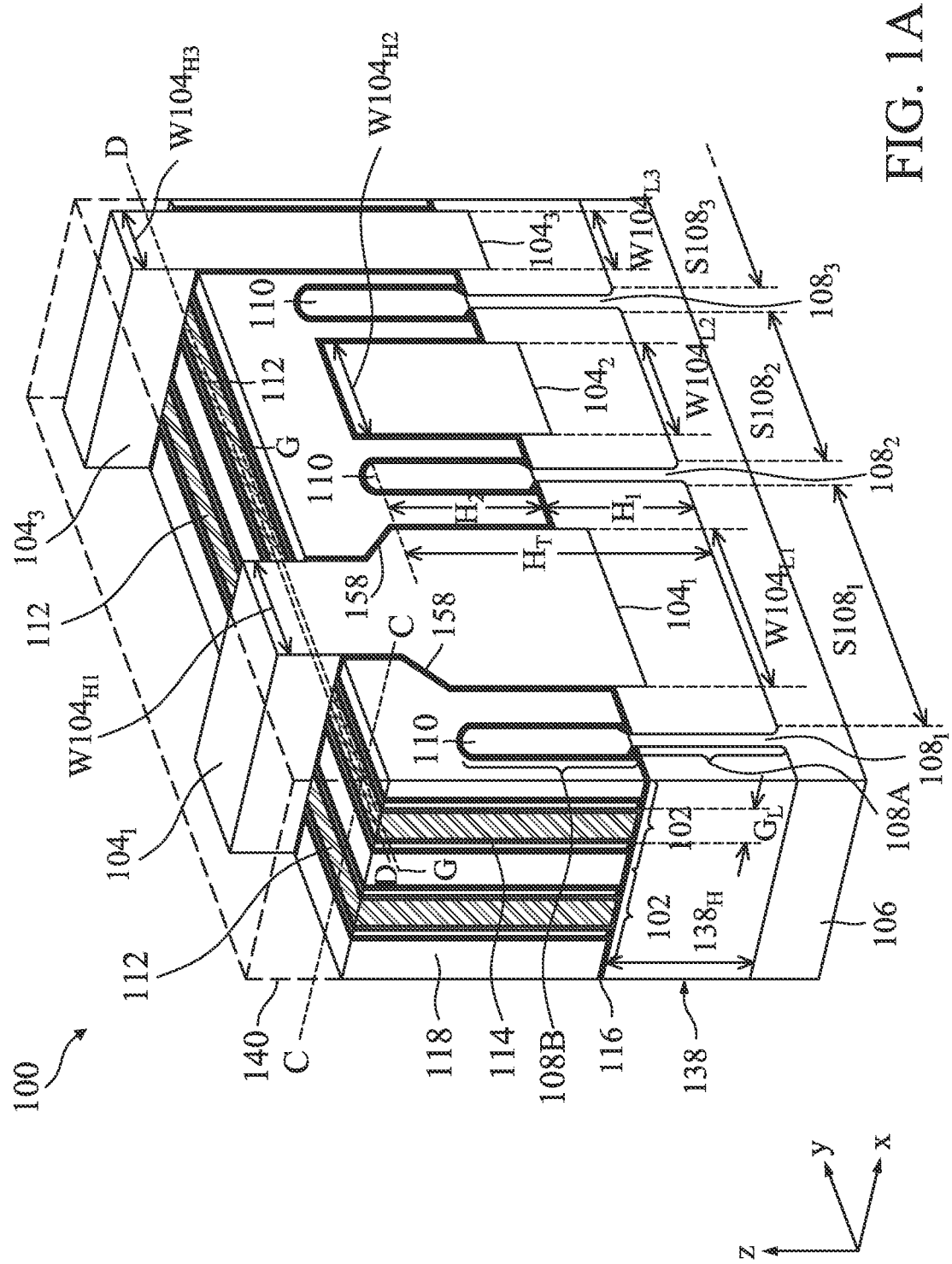
FIGS. 1A and 1B illustrate isometric views of a semiconductor device, respectively, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins associated with fin field effect transistors (finFETs) or gate-all-around (GAA) FETs may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of a target value (e.g., ±1%, ±2%, ±3%, ±4%, and ±5% of the target value).

As used herein, the term "vertical," means nominally perpendicular to the surface of a substrate.

As used herein, the term "insulating layer", refers to a layer that functions as an electrical insulator (e.g., a dielectric layer).

As used herein, the term "selectivity" refers to the ratio of the etch rates of two materials under a same etching condition.

As used herein, the term "etching selectivity of a first layer to the second layer of N or greater" refers to an etching rate associated the first layer is at least N times greater than another etching rate associated with the second layer under a same etching condition.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "insulating layer", as used herein, refers to a layer that functions as an electrical insulator (e.g., a dielectric layer).

Technology advances in the semiconductor industry drive the pursuit of integrated circuits (ICs) having higher device density, higher performance, and lower cost. In the course of the IC evolution, various three dimensional (3D) field-effect transistors (FETs), such as fin-type field effect transistor (FinFET) and gate-all-around (GAA) FETs, have been adopted to achieve ICs with higher device densities. Additionally, a cut poly gate scheme has been proposed to further increase IC device density by selectively removing gate structure to separate metal gate lines between transistors within the IC. For example, the cut poly gate scheme can be performed by selectively exposing a portion of poly gate structures using a lithography process and removing the exposed portion of the poly gate structures using an etching process. However, as transistor size shrinks, the size associated with the respective poly gate structure also shrinks. As a result, the lithography process can fail to completely expose the selected poly gate structure in the cut poly gate scheme, thus reducing a yield of the cut poly gate scheme and causing IC failures.

The present disclosure is directed to a fabrication method and an isolation structure that provides a cut metal gate (CMG) scheme to isolate gate metal line isolation between transistors within an IC. The isolation structure can be formed between two adjacent fin structures on a substrate. A top surface of the isolation structure can be larger than a bottom surface of the isolation structure. For example, an upper portion of the isolation structure can include footing structures formed above a lower portion of the isolation structure. As a result, the footing structures can transition the dimension of the isolation structure from the wider bottom surface to the narrower top surface. In some embodiments, the upper and the lower portions of the isolation structure can be respectively made of first and second insulating materials. In some embodiments, an etching selectivity of the first insulating material to the second insulating material can be greater than 5, such as between about 5 and about 10, for an etching process. A benefit of the present disclosure, among others, is to utilize the footing structures to effectively separate the gate metal line connection between fin structures, thus avoiding transistor failures within the IC.

Figure 1B:
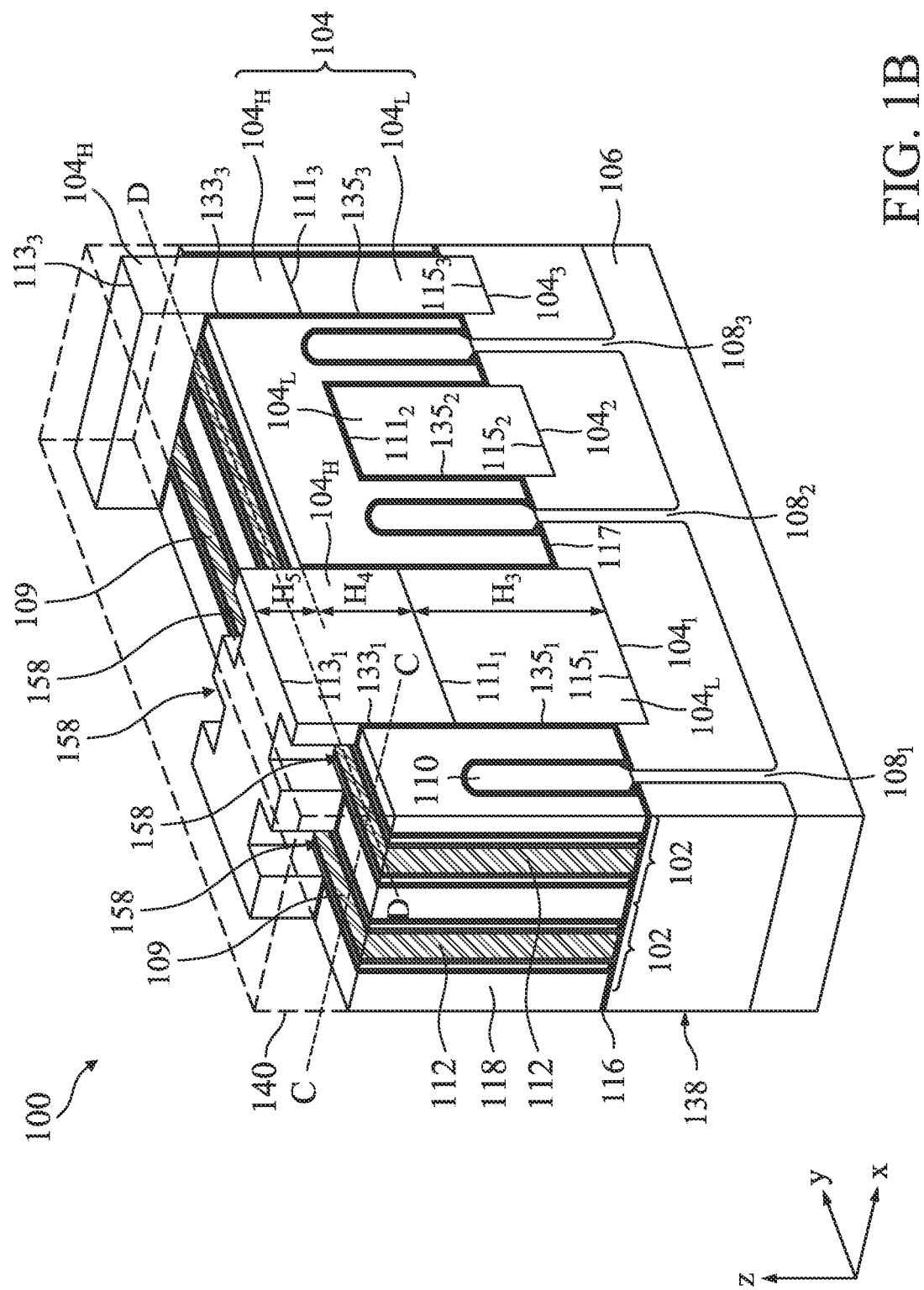
Figure 1C:
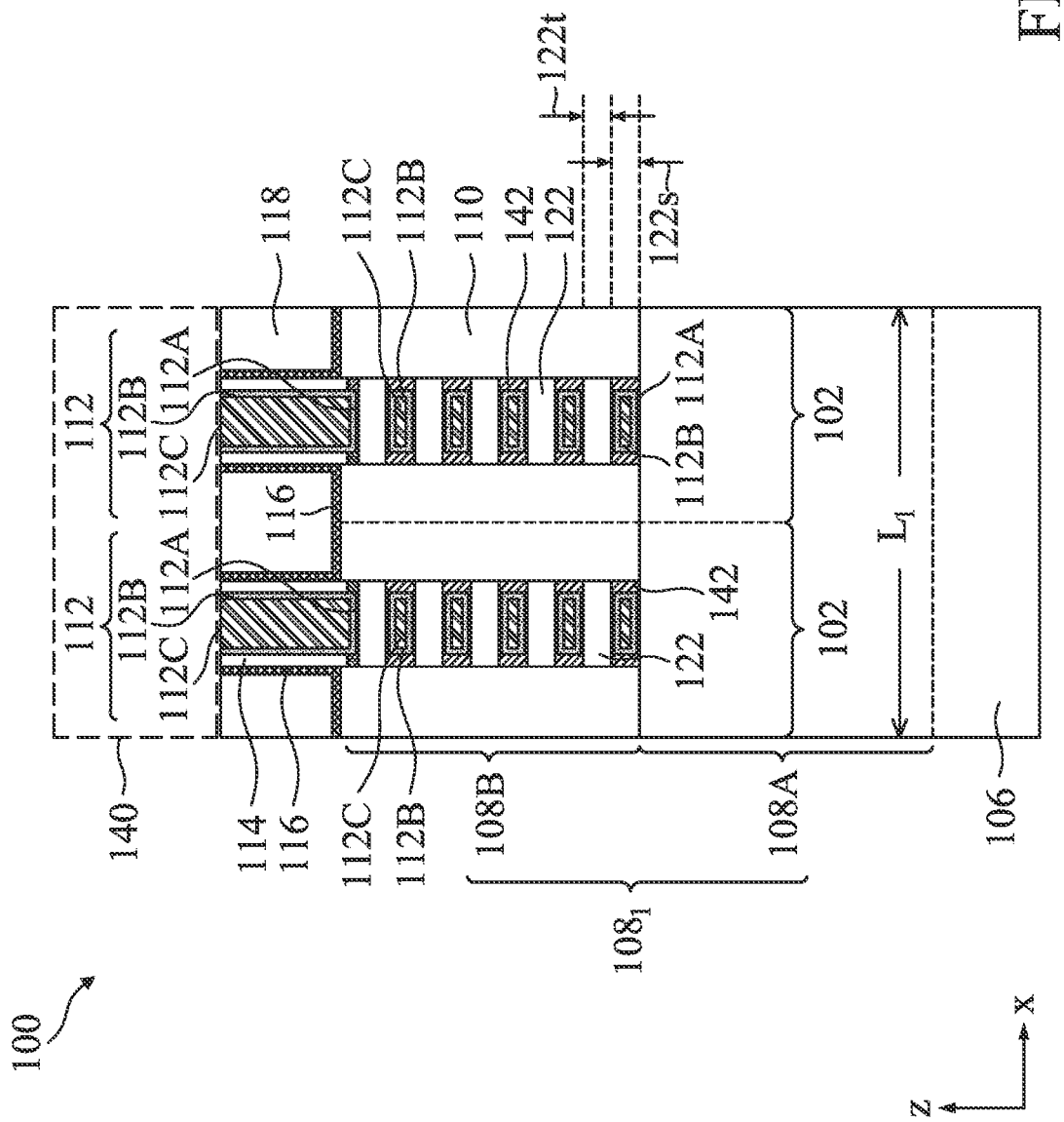
FIGS. 1C-1F illustrate cross-sectional views of a semiconductor device, according to some embodiments.
Figure 1D:
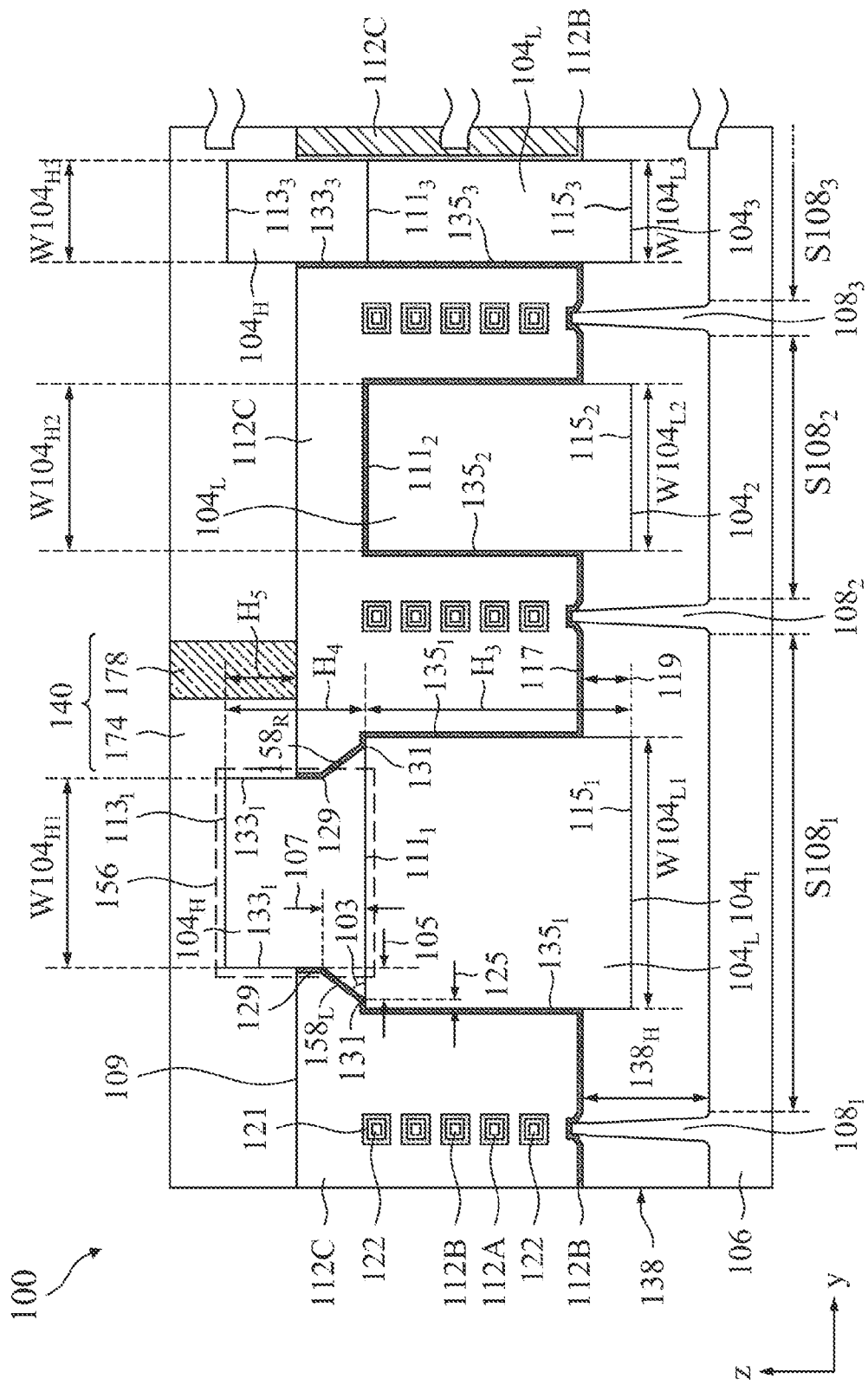
Figure 1E:
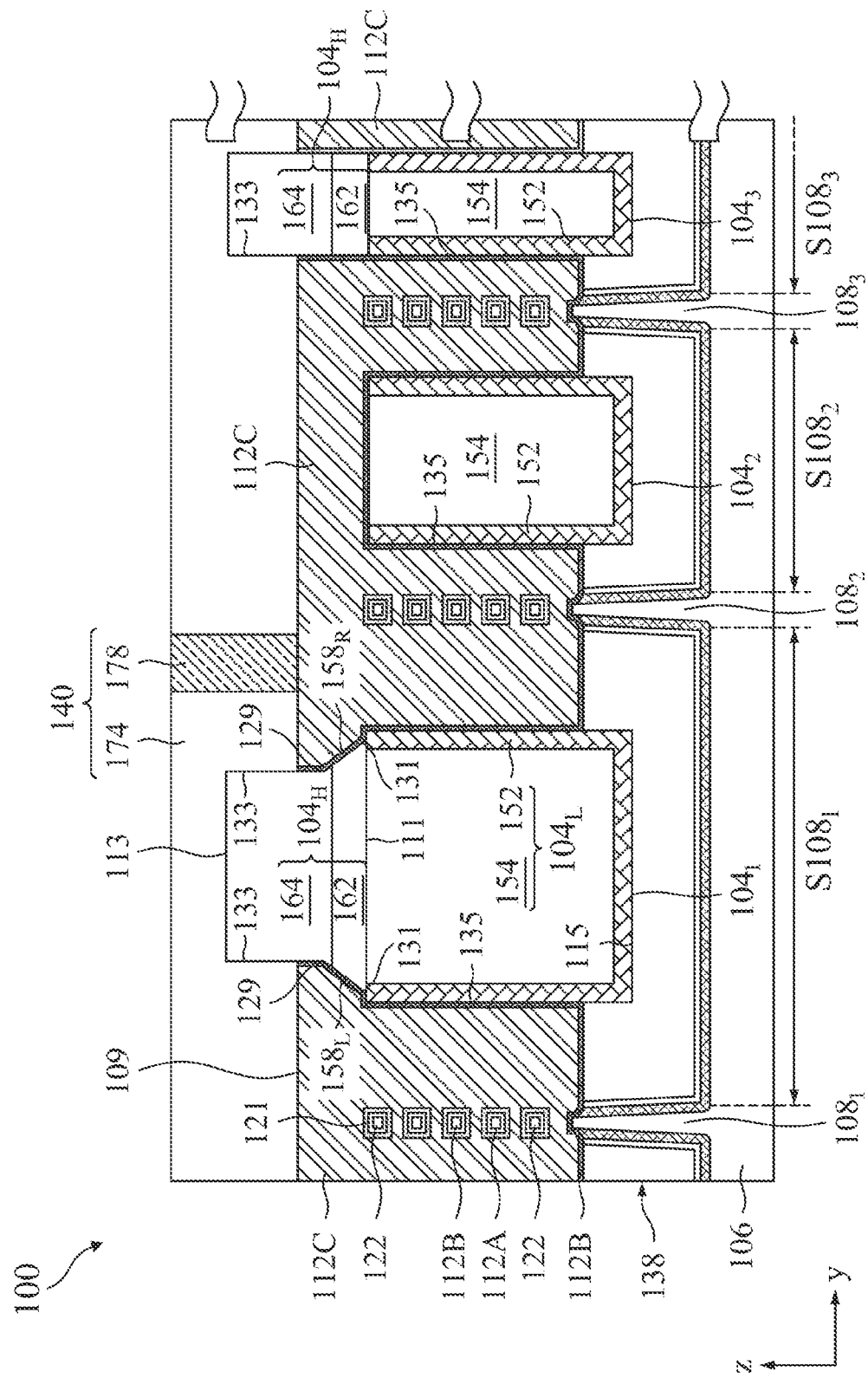
Figure 1F:
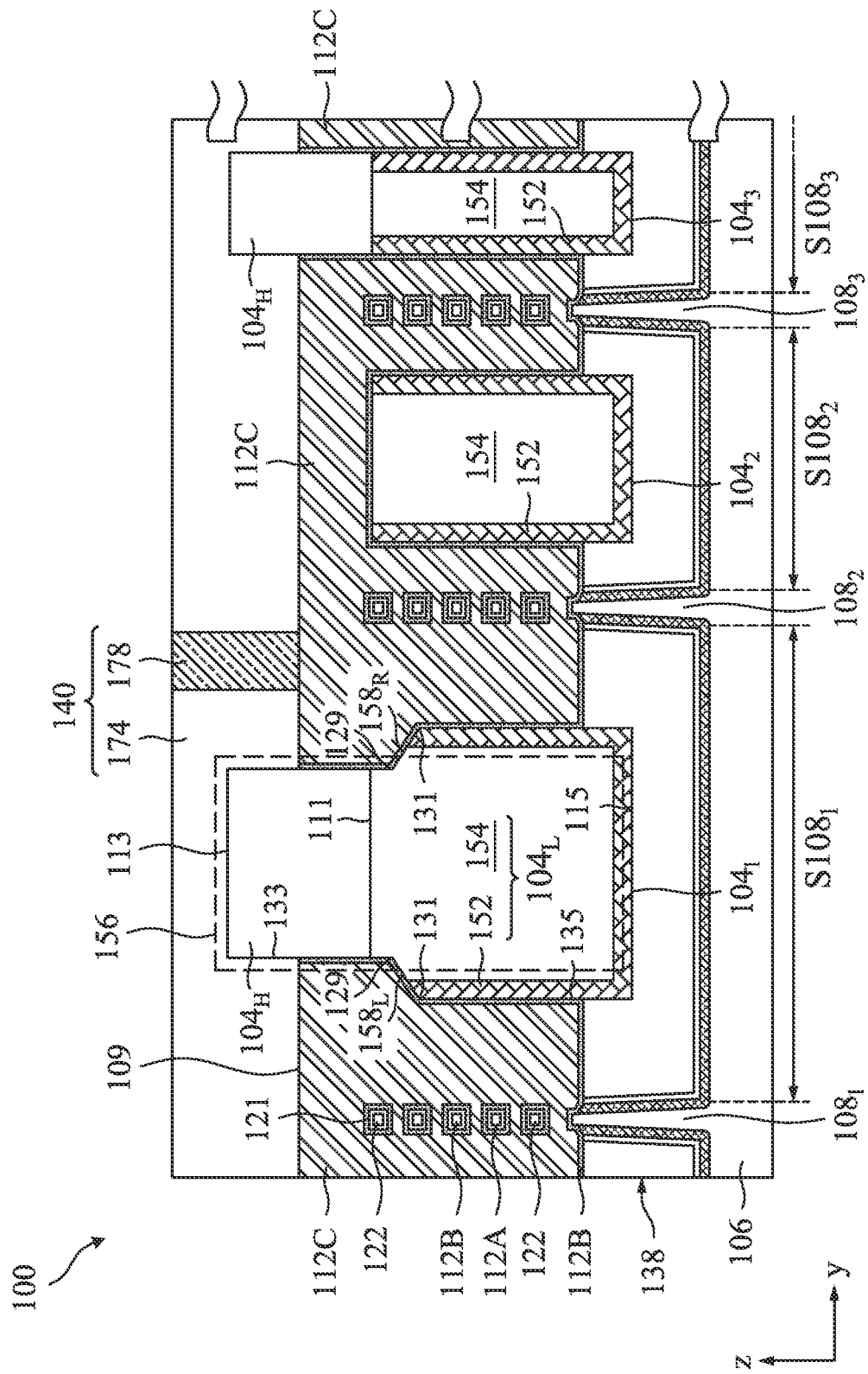

A semiconductor device 100 having multiple FETs 102, is described with reference to FIGS. 1A-1F, according to some embodiments. In some embodiments, each FET 102 can be a finFET or a GAA FET. FIGS. 1A and 1B illustrates isometric views of various embodiments of semiconductor device 100, according to some embodiments. FIG. 1C illustrates a cross-sectional view along gate structure (e.g., line C-C of FIG. 1A and/or line C-C of FIG. 1B) of semiconductor device 100, according to some embodiments. FIGS. 1D-1F illustrate cross-sectional views along FET 102's channel (e.g., line D-D of FIG. 1A and/or line D-D of FIG. 1B), according to some embodiments. Even though two FETs 102 are shown residing in each fin structures 108 (e.g., fin structures $108_1$-$108_3$) in FIGS. 1A and 1B, semiconductor device 100 can have any number of fin structures 108, each accommodating any number of FETs 102. Further, the scale and shapes of various labeled elements in isometric and cross-sectional views of semiconductor device 100 are shown for illustration purposes and not intended to be limiting.

Each FET 102 can include a fin structure 108 extending along an x-axis, and a gate structure 112 traversing through fin structure 108 along an y-axis. Although FIG. 1A shows one fin structure for each FET 102, any number of fin structures 108 can be included in semiconductor device 100 for each FET 102. Each FET 102 can be formed on a substrate 106. Substrate 106 can be a semiconductor material such as, but not limited to, silicon. In some embodiments, substrate 106 can include a crystalline silicon substrate (e.g., wafer). In some embodiments, substrate 106 can include (i) an elementary semiconductor, such as silicon (Si) or germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 106 can be doped depending on design requirements (e.g., p-type substrate or n-type substrate). In some embodiments, substrate 106 can be doped with p-type dopants (e.g., boron (B), indium (In), aluminum (Al), or gallium (Ga)) or n-type dopants (e.g., phosphorus (P) or arsenic (As)).

Referring to FIGS. 1A and 1C, each fin structure 108 (e.g., fin structures $108_1$-$108_3$) can include a fin base portion 108A and a stacked fin portion 108B disposed on fin base portion 108A. Fin base portion 108A can include a material similar to substrate 106, such as a material having a lattice constant substantially close to (e.g., lattice mismatch within 5%) that of substrate 106. In some embodiments, fin base portion 108A can include a material identical to substrate 106. For example, fin base portion 108A can be formed from a photolithographic patterning and an etching of substrate 106. Stacked fin portion 108B can include a semiconductor layer 122 functioned as FET 102's channel layer 122, and a source/drain (S/D) region 110 horizontally (e.g., in the x-direction) in contact with channel layer 122. In some embodiments, stacked fin portion 108B can include multiple channel layers 122, each made of identical or different materials from each other. In some embodiments, stacked fin portion 108B can include multiple channel layers 122, each having a thickness $122t$ and a gap $122s$ separated from each other. Each of thickness $122t$ and gap $122s$ can range from about 3 nm to about 20 nm, and can be equal to or different from each other.

Fin base portion 108A and stacked fin portion 108B can have respective vertical dimensions $H_1$ and $H_2$ (e.g., heights) along a z-axis, each ranging from about 40 nm to about 60 nm. Vertical dimensions $H_1$ and $H_2$ can be equal to or different from each other. A sum of $H_1$ and $H_2$, total height $H_T$ of fin structure 108, can range from about 80 nm to about 120 nm. In some embodiments, fin structure 108 can have a horizontal dimension $L_1$ (e.g., length $L_1$ shown in FIG. 1C) along an x-axis ranging from about 100 nm to about 1 µm. Horizontal dimension $L_1$ of fin structure 108 can be at least 100 nm to prevent the relaxation of strain in fin structure 108, and consequently, prevent the relaxation of strain in channel layers 122 formed under gate structure 112. Other dimensions and materials for fin structure 108 are within the scope and spirit of this disclosure.

S/D region 110 can be grown over fin base portion 108A that are not underlying gate structures 112. Each of channel layers 122 of FET 102 can be interposed between a pair of S/D regions 110. S/D region 110 can include an epitaxially-grown semiconductor material. In some embodiments, the epitaxially grown semiconductor material can be the same material as the material of substrate 106. In some embodiments, the epitaxially-grown semiconductor material can include a material similar to the material of substrate 106. For example, the epitaxially-grown semiconductor material can have a lattice constant substantially close to (e.g., lattice mismatch within 5%) that of the material of substrate 106. In some embodiments, the epitaxially-grown semiconductor material can include: (i) a semiconductor material, such as Ge or Si; (ii) a compound semiconductor material, such as GaAs and/or AlGaAs; or (iii) a semiconductor alloy, such as SiGe and/or GaAsP. S/D region 110 can be doped with p-type dopants or doped with n-type dopants. The p-type dopants can include B, In, Al, or Ga. The n-type dopants can include P or As. In some embodiments, a S/D region 110 of a fin structure 108 (e.g., fin structure $108_1$) on semiconductor device 100 can be doped as n-type, while another S/D region 110 of another fin structure 108 (e.g., fin structure $108_2$) on semiconductor device 100 can be doped as p-type. In some embodiments, S/D region 110 can have multiple sub-regions (not shown) that may include SiGe and may differ from each other based on, for example, doping concentration, epitaxial growth process conditions, and/or relative concentration of Ge with respect to Si. For example, the atomic percent Ge in the sub-region closest to stacked fin portion 108B can be smaller than the atomic percent Ge in the sub-region farthest from stacked fin portion 108B.

Channel layer 122 can include semiconductor materials similar to substrate 106. For example, channel layer 122 can include a semiconductor material having lattice constant substantially close to (e.g., lattice mismatch within 5%) that of substrate 106. In some embodiments, channel layer 122 can include Si or SiGe. In some embodiments, channel layer 122 can include SiGe with a Ge concentration from about 25 atomic percent to about 50 atomic percent with any remaining atomic percent being Si or can include Si without any substantial amount of Ge. In some embodiments, channel layer 122 and substrate 106 can include semiconductor materials with oxidation rates and/or etch selectivity different from each other. Channel layer 122 can be undoped, doped with p-type dopants or doped with n-type dopants. The p-type dopant can include B, In, Al, or Ga. The n-type dopant can include P or As. In some embodiments, a channel layer 122 of FET 102 on a fin structure 108 (e.g., fin structure $108_1$) can be doped as n-type, while another channel layer 122 of another FET 102 on another fin structure 108 (e.g., fin structure $108_2$) can be doped as p-type.

Gate structure 112 can be multi-layered structures that wraps around portions of one or more fin structures 108. For example, gate structure 112 can wrap FET 102's channel layers 122 (e.g., semiconductor layer 122) to modulate a conductivity of FET 102's channel layer 122. In some embodiments, gate structure 112 can be referred to as gate-all-around (GAA) structures, where FET 102 can be referred to as a GAA FET 102. Gate structure 112 can have a horizontal dimension $G_L$ (e.g., gate length; shown in FIG. 1A) along an x-axis ranging from about 3 nm to about 1000 nm.

Gate structure 112 can include an oxide layer 112A, a gate dielectric layer 112B disposed on oxide layer 112A, a gate electrode 112C disposed on dielectric layer 112B, and gate spacers 114 disposed on sidewalls of gate electrode 112C. Oxide layer 112A and gate dielectric layer 112B can be wrapped around each of channel layers 122, hence electrically isolating channel layers 122 from each other and from gate electrode 112C. Oxide layer 112A and gate dielectric layer 112B can be disposed between gate electrode 112C and S/D regions 110 to prevent electrical shorting in between.

Oxide layer 112A can be an interfacial dielectric layer sandwiched between each channel layer 122 and gate dielectric layer 112B. In some embodiments, oxide layer 112A can include a semiconductor oxide material (e.g., silicon oxide or silicon germanium oxide) and can have a thickness ranging from about 1 nm to about 10 nm.

Gate dielectric layer 112B can include silicon oxide and can be formed by chemical vapor deposition (CVD), atomic layer deposition (ALD), physical vapor deposition (PVD), e-beam evaporation, or other suitable processes. In some embodiments, gate dielectric layer 112B can include (i) a layer of silicon oxide, silicon nitride, and/or silicon oxynitride, (ii) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, gate dielectric layer 112B can include a single layer or a stack of insulating material layers. Gate dielectric layer 112B can have a thickness ranging from about 1 nm to about 5 nm. Other materials and formation methods for gate dielectric layers 112B are within the scope and spirit of this disclosure.

Gate electrode 112C can be configured as gate terminal of FET 102. Gate electrode 112C can include metal stacks wrapping about each of channel layers 122. Depending on the spaces between adjacent channel layers 122 and the thicknesses of the layers of gate structures 112, each channel layers 122 can be wrapped around by one or more layers of gate electrodes 112C filling the spaces between adjacent channel layers 122. In some embodiments, gate electrode 112C can include a gate barrier layer (not shown in FIGS. 1A-1F), a gate work function layer (not shown in FIGS. 1A-1F), and a gate metal fill layer (not shown in FIGS. 1A-1F). The gate barrier layer can serve as a nucleation layer for subsequent formation of a gate work function layer. The gate barrier layer can further prevent substantial diffusion of metals (e.g., aluminum) from the gate work function layer to underlying layers (e.g., gate dielectric layers 112B or oxide layers 112A). The gate barrier layer can include titanium (Ti), tantalum (Ta), titanium nitride (TiN), tantalum nitride (TaN), or other suitable diffusion barrier materials. The gate work function layer can include a single metal layer or a stack of metal layers. The stack of metal layers can include metals having work function values equal to or different from each other. In some embodiments, the gate work function layer can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. In some embodiments, the gate work function layer can include Al-doped metal, such as Al-doped Ti, Al-doped TiN, Al-doped Ta, or Al-doped TaN. Gate metal fill layer can include a single metal layer or a stack of metal layers. The stack of metal layers can include metals different from each other. In some embodiments, the gate metal fill layer can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. Other materials for the gate barrier layer, the gate work function layer, and the gate metal fill layer are within the scope and spirit of this disclosure.

Gate spacer 114 can be in physical contact with oxide layers 112A and gate dielectric layers 112B, according to some embodiments. Gate spacer 114 can have a low-k material with a dielectric constant less than about 3.9. For example, gate spacer 114 can include insulating material, such as silicon oxide, silicon nitride, a low-k material, or a combination thereof. In some embodiments, gate spacer 114 can have a thickness ranging from about 2 nm to about 10 nm. Other materials and thicknesses for gate spacer 114 are within the scope and spirit of this disclosure.

Referring to FIGS. 1A and 1C, each FET 102 can further include multiple inner spacers 142, multiple etch stop layers (ESL) 116, and multiple interlayer dielectric (ILD) layers 118. Inner spacer 142 can be disposed between gate structure 112 and S/D region 110. For example, inner spacer 142 can be in contact with gate dielectric layers 112B and/or oxide layers 112A, according to some embodiments. In some embodiments, inner spacer 142 can be disposed between each vertically (in the z-direction) adjacent channel layers 122. Inner spacer 142 can have a low-k material with a dielectric constant less than about 3.9. For example, inner spacer 142 can include insulating material, such as silicon oxide, silicon nitride, a low-k material, or a combination thereof. In some embodiments, inner spacer 142 can have a thickness ranging from about 2 nm to about 10 nm. Other materials and thicknesses for inner spacers 142 are within the scope and spirit of this disclosure.

ESL 116 can be configured to protect gate structure 112 and/or S/D region 110. This protection can be provided, for example, during formation of ILD layer 118 and/or S/D contact structures (not shown). ESL 116 can be disposed on sidewalls of gate spacers 114 and/or surfaces of S/D region 110. In some embodiments, ESL 116 can include, for example, silicon nitride, silicon oxide, silicon oxynitride, silicon carbide, silicon carbo-nitride, boron nitride, silicon boron nitride, silicon carbon boron nitride, or a combination thereof. In some embodiments, ESL 116 can have a thickness ranging from about 3 nm to about 30 nm. Other materials and thicknesses for ESL 116 are within the scope and spirit of this disclosure.

ILD layer 118 can be disposed on ESL 116 and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material can be silicon oxide. In some embodiments, ILD layer 118 can have a thickness from about 50 nm to about 200 nm. Other materials, thicknesses, and formation methods for ILD layer 118 are within the scope and spirit of this disclosure.

Referring to FIGS. 1A and 1C, semiconductor device 100 can further include shallow trench isolation (STI) regions 138. STI regions 138 can be configured to provide electrical isolation between horizontally (e.g., in the y-direction) adjacent fin structures 108. For example, STI regions 138 can electrically isolate fin structure $108_1$ from fin structure $108_2$. As such, STI regions 138 can be configured to provide electrical isolation between FETs 102 residing on different fin structures 108. Also, STI regions 138 can be configured to provide electrical isolation between FETs 102 and neighboring active and passive elements (not shown) integrated with or deposited on substrate 106. In some embodiments, STI regions 138 can include multiple layers, such as a nitride layer, an oxide layer disposed on the nitride layer, and an insulating layer disposed on the nitride layer. In some embodiments, the insulating layer can include silicon oxide, silicon nitride, silicon oxynitride, fluorine-doped silicate glass (FSG), a low-k dielectric material, and/or other suitable insulating materials. In some embodiments, STI regions 138 can have a vertical dimension $138_H$ (e.g., height) along a z-axis ranging from about 40 nm to about 60 nm. In some embodiments, vertical dimension $138_H$ can be half of the total height $H_T$ of fin structures 108.

Referring to FIG. 1A, semiconductor device 100 can further include multiple isolation structures 104 (e.g., isolation structures $104_1$-$104_3$), each extending through gate structure 112 along the x-axis and being disposed over STI region 138. Each isolation structure 104 can be disposed between two horizontally (e.g., in the y-direction) adjacent fin structures 108. For example, isolation structures $104_1$ can be disposed between fin structure $108_1$ and fin structure $108_2$. Similarly, isolation structures $104_2$ can be disposed between fin structure $108_2$ and fin structure $108_3$. In some embodiments, ESL 116 and ILD layer 118 can both be disposed over portions of isolation structure 104 outside gate structure 112. Further, ESL 116 and ILD layer 118 can both be disposed between an isolation layer 104 and fin structures 108 adjacent to the isolation layer 104. In some embodiments, a portion of isolation structure 104's sidewalls can be covered by ESL 116, while another portion of isolation structure 104's sidewalls can be buried under STI region 138.

Each isolation structure 104 can have a top width $W104_H$ (e.g., widths $W104_{H1}$-$W104_{H3}$) and a bottom width $W104_L$ (e.g., widths $W104_{L1}$-$W104_{L3}$). Top width $W104_H$ can be associated with a critical dimension of the CMG scheme provided by isolation structure 104, where the critical dimension of the CMG scheme can be associated with pitch sizes of FETs 102 of semiconductor device 100. Bottom width $W104_L$ can be associated with a separation S108 (e.g., separations $S108_1$-$S108_3$) between fin structures 108 adjacent to isolation structure 104. For example, the larger the S108, the larger the $W104_L$ can be. In some embodiments, fin structures $108_1$ and $108_2$ can be relatively far from each other and fin structures $108_2$ and $108_3$ can be relatively close to each other (e.g., separation $S108_1$>separation $S108_2$), such that isolation structure $104_1$ can have wider bottom width than isolation structure $104_2$ (e.g., bottom width $W104_{L1}$>bottom width $W104_{L2}$). In some embodiments, each separation S108 can range from about 5 nm to about 500 nm. In some embodiments, each bottom width $W104_L$ can range from about 5 nm to about 500 nm. Top width $W104_H$ can be substantially equal to or less than bottom width W104$_L$. In some embodiments, top width W104$_H$ can be between about 10 nm and about 100 nm.

Each isolation structure 104 can include one or more layers, each layer including an insulating material, such as silicon oxide, silicon nitride, a high-k dielectric, or a low-k dielectric to electrically isolate fin structures 108 placed at opposite sides of isolation structure 104. In some embodiments, one or more isolation structures 104 can be further configured to electrically isolate gate structures 112 traversed through by isolation structure 104. For example, as shown in FIG. 1A, isolation structure 104$_1$'s top surface can be positioned above gate structure 112's top surface. Therefore, isolation structure 104$_1$ can electrically isolate gate structure 112 traversed by isolation structure 104$_1$. As such, a segment of gate structure 112 associated with FETs 102 on fin structure 108$_1$ will be electrically insulated from another segment of gate structure 112 associated with FETs 102 on fin structure 108$_2$. In some embodiments, semiconductor device 100 can include a first (e.g., isolation structure 104$_1$) and a second (e.g., isolation structure 104$_2$) isolation structures 104 extending through gate structure 112, where the first isolation structure 104's top (e.g., isolation structure 104$_1$'s top) can be positioned above gate structure 112 to electrically isolate segments of gate structure 112 traversed by the first isolation structure 104 (e.g., isolation structure 104$_1$), while the second isolation structure 104 (e.g., isolation structure 104$_2$) can be buried by gate structure 112, thus another segments of gate structure 112 that traverse through the second isolation structure 104 (e.g., isolation structure 104$_2$) can remain electrically connected to each other.

Referring to FIGS. 1B, 1D, and 1E, each isolation structure 104 on semiconductor device 100 can include a lower region 104$_L$ with a top surface 111 (e.g., top surfaces 111$_1$-111$_3$), a bottom surface 115 (e.g., bottom surfaces 115$_1$-115$_3$), and sidewalls 135 (e.g., sidewalls 135$_1$-135$_3$) between top surface 111 and bottom surface 115. Each lower region 104$_L$ can include one or more layers, each layer including an insulating material. For example, as shown in FIG. 1E, lower region 104$_L$ can include a bulk region 154 and a liner 152 surrounding bulk region 154. Bulk region 154 and liner 152 can include different insulating materials. In some embodiments, liner 152 can include an insulating material having greater dielectric constant than another insulating material included in bulk region 154. For example, bulk region 154 can include silicon oxide or silicon nitride, and liner 152 can include an insulating material containing carbon. Each lower region 104$_L$ can be buried under gate structure 112 traversed by lower region 104$_L$. For example, top surface 111 can be below a top surface 109 of gate structure 112. In some embodiments, top surface 111 can be substantially coplanar with channel 122's top surface 121 (shown at FIG. 1D). Each lower region 104$_L$ can be partially buried in STI region 138. For example, bottom surface 115 that in contact with STI region 138 can be blow STI region 138's top surface 117. In some embodiments, STI region 138's top surface 117 can be above bottom surface 115 and below top surface 111. Lower region 104$_L$ can have a height H$_3$ (e.g., a separation between top surface 111 and bottom surface 115). In some embodiments, height H$_3$ can be shorter than fin portion 108B's height H$_2$ (shown in FIG. 1A). In some embodiments, height H$_3$ can be between about 20 nm and about 100 nm. In some embodiments, lower region 104$_L$'s bottom surface 115 can have a width substantially equal to bottom width W104$_L$. In some embodiments, bottom width W104$_L$ can be substantially equal to a separation between sidewalls 135.

In some embodiments, one or more isolation structures 104 on semiconductor device 100 can further include an upper region 104$_H$ disposed over lower region 104$_L$. Upper region 104$_H$ can have a top surface 113 (e.g., top surfaces 113$_1$ and 113$_3$) and sidewalls 133 (e.g., sidewalls 133$_1$ and 133$_3$) below top surface 113. Top surface 113 can be above a top surface 109 of gate structures 112 traversed by upper region 104$_H$. Therefore, each upper region 104$_H$ can provide the CMG scheme electrically insulating gate structures 112 traversed through by upper region 104$_H$. In some embodiments, top surface 113 can be isolation structure 104's top surface. In some embodiments, upper region 104$_H$'s top surface 113 can have a width substantially equal to top width W104$_H$. In some embodiments, top width W104$_H$ can be substantially equal to a separation between sidewalls 133. Upper portion 104$_H$ can have a height H$_4$ (e.g., a separation between top surface 113 and lower region 104$_L$'s bottom surface 115) between about 5 nm and about 20 nm. In some embodiments, top surface 113 can be above top surface 109 by H$_5$ ranging from about 10 nm to 30 nm. Upper region 104$_H$ and lower region 104$_L$ can each include insulating materials having different etching selectivity from each other for an etching process. For example, upper region 104$_H$ can include silicon nitride and lower region 104$_L$ can include silicon oxide, where silicon oxide and silicon nitride can have different etching selectivity from each other for a dry etching process. In some embodiments, upper region 104$_H$ and lower region 104$_L$ can respectively include a first insulating material and a second insulating material, where a dry etching process can have an etching selectivity of the second insulating material to the first insulating material of about 5 or greater. In some embodiments, upper region 104$_H$ can include multiple layers, each layer including an insulating material. At least one of the multiple layers can include an insulating material having different etching selectivity as lower region 104$_L$. For example, as shown in FIG. 1E, upper region 104$_H$ can include a layer 162 and a layer 164 disposed over layer 162. At least one of layers 162 and 164 can include an insulating material having different etching selectivity as lower region 104$_L$ for a dry etching process. In some embodiments, layer 162 can be in contact with lower region 104$_L$ and can include an insulating material associated with an etching rate of about 5 times or greater than the insulating material of lower region 104$_L$ for a dry etching process.

Referring to FIGS. 1A and 1B, in some embodiments, one or more isolation structures 104 on semiconductor device 100 can further include footing regions 158 that form slanting sidewalls for isolation structure 104. For example, as shown in FIG. 1A, isolation structure 104$_1$ can include footing regions 158 disposed at opposite sides of isolation structure 104$_1$ to form slanting sidewalls for isolation structure 104$_1$. In some embodiments, footing regions 158 can be placed along isolation structure 104. For example, as shown in FIG. 1A, footing region 158 can be extended horizontally (e.g., along the x-direction) and traversed through gate structures 112. In some embodiments, footing regions 158 can be selectively disposed over portions of isolation structure 104 that intersect with gate structures 112. For example, as shown in FIG. 1B, footing regions 158 can be selectively placed at portions of isolation structure 104$_1$ traversed by each gate structure 112, where each footing region 158 can be buried by each gate structure 112 that traverses isolation structure 104$_1$. The one or more isolation structures 104 that include footing region 158 can have narrower top width W104$_H$ than its bottom width W104$_L$. For example, footing region 158 of isolation structure 104$_1$ can transition isolation structure $104_1$ from a wider bottom width $W104_{L1}$ to a narrower top width $W104_{H1}$. The benefit of narrower top width $W104_{H1}$ is to allow isolation structure $104_1$ to provide a compact CMG scheme for FETs 102 to meet scaling requirements (e.g., Moore's law). Further, the wider bottom width $W104_{L1}$ can allow isolation structure $104_1$ to provide a robust CMG scheme for FETs 102 to ensure a reliable electrical isolation for metal gate structures traversed by isolation structure $104_1$. In some embodiments, for each isolation structures 104 (e.g., isolation structures $104_2$ or $104_3$) that exclude footing regions 158, its top width $W104_H$ can be substantially identical to bottom width $W104_L$. For example, isolation structures $104_2$ and $104_3$ can each exclude footing region 158. Therefore, $W104_{H2}$ and $W104_{H3}$ can be substantially identical to $W104_{L2}$ and $W104_{L3}$, respectively.

Referring to FIG. 1D, in some embodiments, semiconductor device 100 can include a first group of isolation structures 104, a second group of isolation structures 104, and a third group of isolation structures 104. The first group of isolation structures 104 (e.g., isolation structure $104_1$) can each include lower region $104_L$ and upper region $104_H$ having footing regions 158. The first group of isolation structures 104 can each include a top surface (e.g., top surface $113_1$) above gate structure 112's top surface 121. The second group of isolation structures 104 (e.g., isolation structure $104_2$) can each include lower region $104_L$ in contact with gate structure 112. As such, the second group of isolation structures 104 can each be buried under gate structure 112 and can have a top surface (e.g., top surface $113_2$) below gate structure 112's top surface 121. Further, the second group of isolation structures 104 can each have a top width (e.g., top width $W104_{H2}$) substantially identical to its bottom width (e.g., bottom width $W104_{L2}$). The third group of isolation structures 104 (e.g., isolation structure $104_3$) can include lower region $104_L$ and upper region $104_H$ connecting to lower region $104_L$ via substantially vertical sidewalls. As such, the third group of isolation structures 104 can each have a top width (e.g., top width $W104_{H3}$) substantially identical to its bottom width (e.g., bottom width $W104_{L3}$). Further, the third group of isolation structures 104 can each include a top surface (e.g., top surface $113_3$) above gate structure 112's top surface 121.

Each of isolation structures 104 (e.g., isolation structure $104_1$) that includes footing regions 158 can further include a center region 156 sandwiched by footing regions 158. For example, center region 156 can be a middle portion of isolation structure 104 between isolation structure 104's opposite sides (e.g., sidewalls 133 and/or sidewalls 135). Footing regions 158 (e.g., a footing region $158_L$ and a footing region $158_R$) can be placed on opposite sides of center region 156. Each footing region 158 can be tapered towards center region 156 from a first end 131 of each footing region 158 to a second end 129 of each footing region 158. As shown in FIG. 1D, isolation structure $104_1$'s bottom (e.g., bottom surface $115_1$) can be relatively close to first end 131 than second end 129, while isolation structure $104_1$'s top (e.g., top surface $113_1$) can be relatively close to second end 129 than first end 131. In some embodiments, a vertical (e.g., in the z-direction) displacement 107 between first end 131 and second end 129 can be formed and can be between about 1 nm and about 10 nm, because of the mean free path associated with the dry etching plasma. Further, a separation between first ends 131 of footing regions 158 (e.g., a footing region $158_L$ and a footing region $158_R$) can be greater than another separation between second ends 129 of footing regions 158 (e.g., a footing region $158_L$ and a footing region $158_R$). In some embodiments, a horizontal (e.g., in the y-direction) displacement 105 between first end 131 and second end 129 can be formed and can be between about 1 nm and about 5 nm, because in view of the dry etching capability. As such, each footing region 158 can be tapered towards center region 156 with an acute angle 103. In some embodiments, acute angle 103 can be from about 1 degree to about 45 degrees.

In some embodiments, isolation structure 104 (e.g., isolation structure $104_1$) can include lower region $104_L$ and upper region $104_H$, where upper region $104_H$ can include center region 156 and footing regions 158. As shown in FIG. 1D, upper region $104_H$ can include isolation structure $104_1$'s top surface $113_1$, where upper region $104_H$'s sidewalls 133 can represent center region 156's sidewall and can be above footing regions 158. Also, footing regions 158 can be disposed over lower region $104_L$, thus being above lower region $104_L$'s sidewalls 135. In some embodiments, first end 131 can be substantially coplanar with lower region $104_L$'s top surface 111. In some embodiments, first end 131 can be substantially coplanar with fin structures 108's top surface 121. Each footing region 158 can therefore be disposed between sidewalls 135 and sidewalls 133. Further, each footing region 158 can be tapered from sidewalls 135 towards sidewall 133, where sidewalls 133 and sidewalls 135 can be respectively adjacent to isolation structure 104's top (e.g., top surface $113_1$) and bottom (e.g., bottom surface $115_1$). In some embodiments, sidewalls 133 and/or sidewalls 135 can be substantially perpendicular to substrate 106. In some embodiments, first end 131 can be horizontally (e.g., in the y-direction) displaced from lower region $104_L$'s sidewalls 135. For example, first end 131 can be away from sidewalls 135 with a separation 125 between about 1 nm and about 5 nm. In some embodiments, first end 131 can be substantially horizontally (e.g., in the y-direction) aligned to sidewalls 135, such that separation 125 can be substantially equal to about zero (this embodiment is not shown in FIG. 1D).

Referring to FIG. 1E, in some embodiments, each footing regions 158 (e.g., a footing region $158_L$ and a footing region $158_R$) can include one or more layers that contact lower portion $104_L$ and include an insulating material having different etching selectivity as lower region $104_L$ for an etching process. For example, each footing region 158 can include layer 162 that can include first end 131. In some embodiments, each footing region 158's second end 129 can be included in layer 162 (this embodiment is not shown in FIG. 1E). In some embodiments, each footing region 158 can further include layer 164 that can include second end 129.

Referring to FIG. 1F, in some embodiments, lower region $104_L$ can include footing regions 158 (e.g., a footing region $158_L$ and a footing region $158_R$). For example, each footing region 158 can include bulk region 154 and/or liner 152. Both first end 131 and second end 129 can be below lower region $104_L$'s top surface 111. As such, footing region 158 can include an insulating material having different etching selectivity as upper region $104_H$ for an etching process. For example, bulk region 154 can include both first end 131 and second end 129. In some embodiments, liner 152 can include first end 131, and bulk region 154 can include second end 129.

In some embodiments, footing region 158 can be included in both upper region $104_H$ and lower region $104_L$ (this embodiment is not shown in FIGS. 1B-1F). For example, first end 131 can be included in lower region $104_L$, and second end 129 can be included in upper region $104_H$. As such, lower region 104$_L$'s top surface 111 can be above first end 131 and below second end 129. Further, first end 131 and second end 129 can include insulating material layers (e.g., bulk region 154 and layer 162, respectively) that can have different etching selectivity to each other for an etching process.

Referring to FIGS. 1A-1F, in some embodiments, semiconductor device 100 can further include an interconnect structure 140 formed over gate structure 112 and ILD layers 118. Interconnect structure 140 can be configured to connect underlying gate structure 112 and underlying S/D regions 110 to other elements of the integrated circuit (not shown in FIGS. 1A-1F). Interconnect structure 140 can include a middle end of line (MEOL) insulating layer 174 and a trench conductor 178 embedded in MEOL insulating layer 174. In some embodiments, portions of ILD layers 118 and/or portions of ESL 116 can be included in interconnect structure 140. MEOL insulating layer 174 can be made of any suitable insulating material, such as a low-k dielectric material. Trench conductor 178 can be in contact with gate electrodes 112C of underlying gate structure 112 and/or underlying S/D regions 110. Trench conductor 178 can be made of conductive materials, such as W, Al, Cu, and Co. In some embodiments, trench conductor 178 can further include barrier liner (not shown) configured as a diffusion barrier, where the barrier liner can include a single layer or a stack of conductive materials, such as TiN, Ti, Ni, TaN, Ta, or a combination thereof. MEOL insulating layer 174 can have an average vertical dimension (e.g., height in the z-direction) from about 30 nm to about 600 nm. Trench conductor 178 can have an average horizontal dimension (e.g., width in the x-direction or y-direction) from about 15 nm to about 25 nm and can have an average vertical dimension (e.g., height in the z-direction) from about 400 nm to about 600 nm. The barrier liner can have a thickness from about 1 nm to about 2 nm, according to some embodiments. Based on the disclosure herein, other materials and dimensions for MEOL insulating layer 174, trench conductor 178, and the barrier liner are within the scope and spirit of this disclosure.

Figure 2:
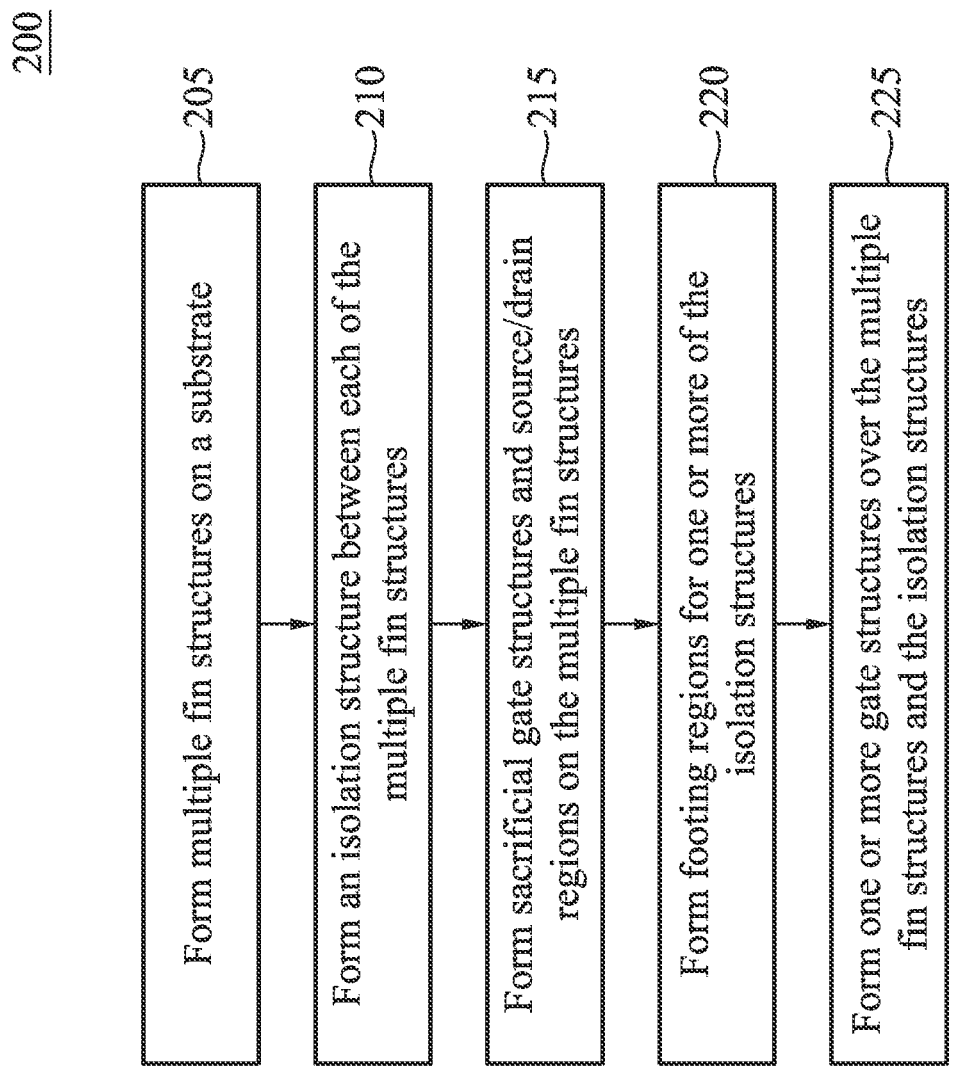
FIG. 2 is a flow diagram of a method for fabricating a semiconductor device, according to some embodiments.
Figure 4A:
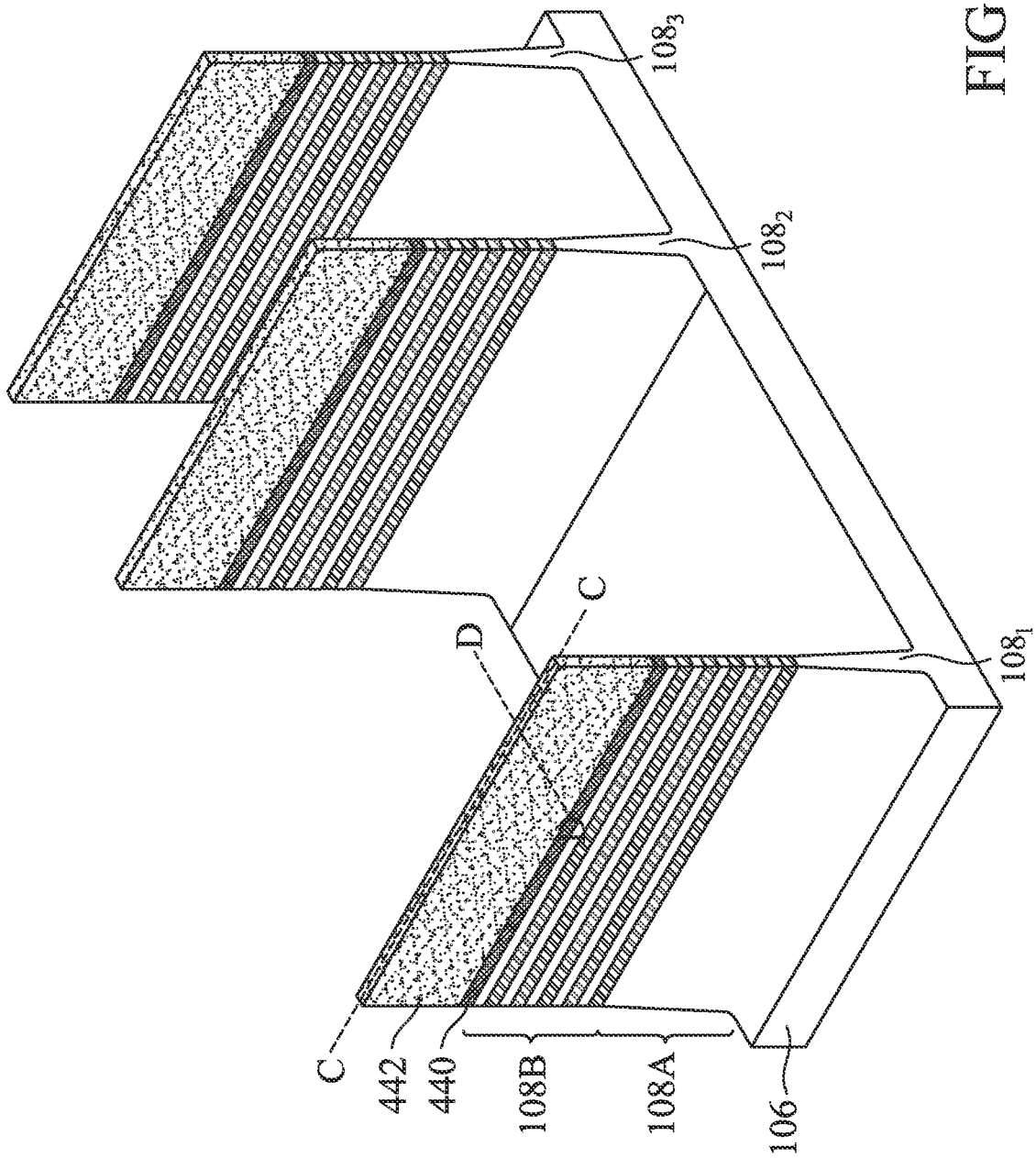
Figures 4B, 4C:
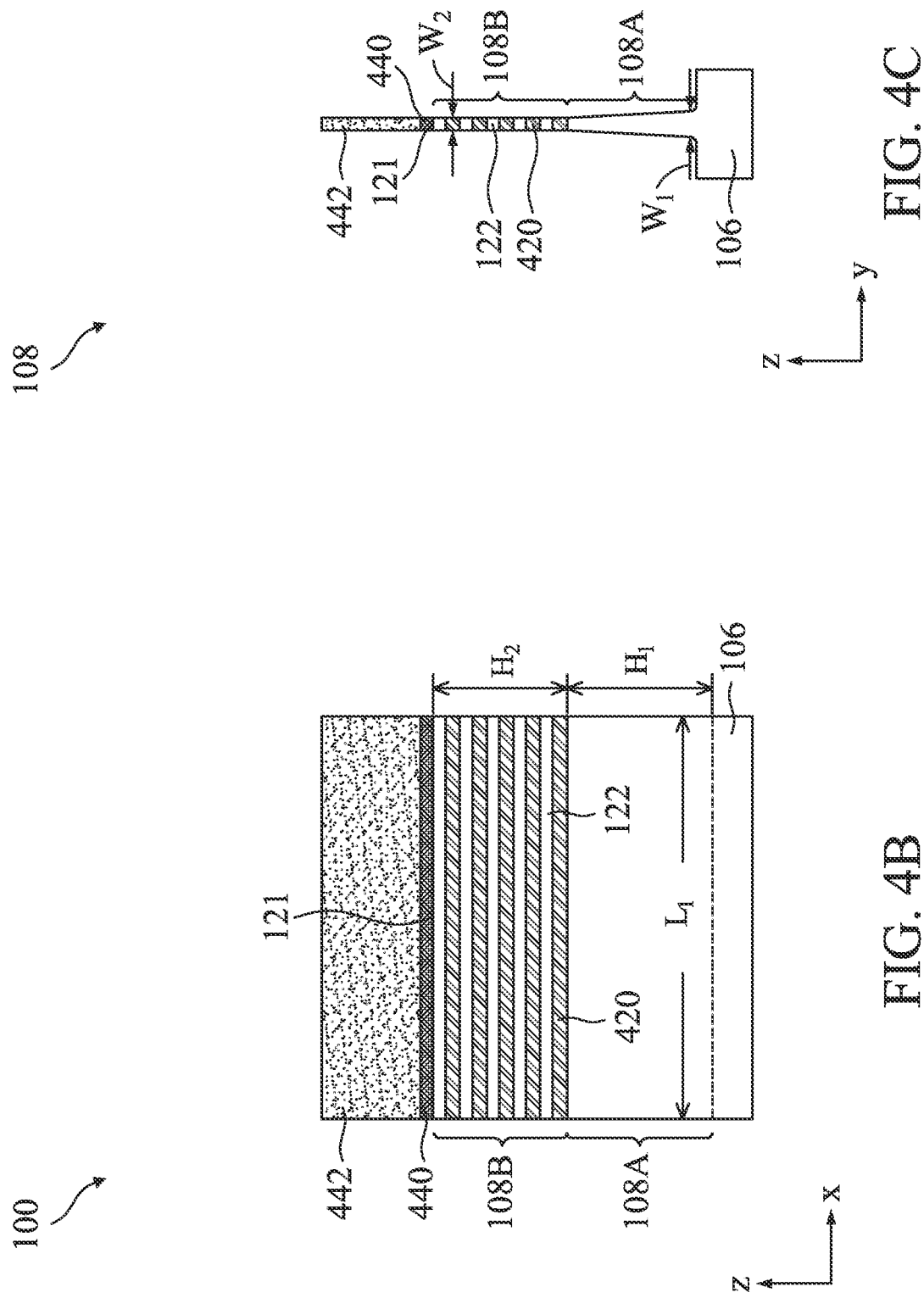

FIG. 2 is a flow diagram of an example method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3A-3C, 4A-4C, 5-16, 17A-17B, and 18A-18B. FIGS. 3A and 4A are isometric views of semiconductor device 100 at various stages of its fabrication, according to some embodiments. FIGS. 3B and 4B are cross-sectional views along line C-C of FIGS. 3A and 4A, respectively, according to some embodiments. FIGS. 5-12 and 17A-18A are cross-sectional views along line C-C of structures of FIG. 4A at various stages of its fabrication to form semiconductor device 100. FIGS. 3C and 4C are cross-sectional views along line D-D of FIGS. 3A and 4A, respectively, according to some embodiments. FIGS. 13-16 and 17B-18B are cross-sectional views along line D-D of structures of FIG. 4A at various stages of its fabrication to form semiconductor device 100. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Further, the discussion of elements in FIGS. 1A-1F, 3A-3C, 4A-4C, 5-16, 17A-17B, and 18A-18B with the same annotations applies to each other, unless mentioned otherwise.

In operation 205, multiple fin structures are formed on a substrate. For example, as shown in FIG. 4A, fin structures 108 (e.g., fin structures $108_1$-$108_3$) with fin base portion 108A and stacked fin portion 108B can be formed on substrate 106 as described with reference to FIGS. 3A-3C and 4A-4C. The formation of fin structures 108 can include the formation of a stacked layer 308 on substrate 106 as shown in FIGS. 3A-3C. Stacked layer 308B can include first and second semiconductor layers 320 and 322 stacked in an alternating configuration. Each of first and second semiconductor layers 320 and 322 can include semiconductor materials different from each other. In some embodiments, first and second semiconductor layers 320 and 322 can include semiconductor materials with oxidation rates and/or etch selectivity different from each other. Each of first and second semiconductor layers 320 and 322 can be epitaxially grown on its underlying layer. In some embodiments, each of first and second semiconductor layers 320 and 322 can be epitaxially grown using (i) a CVD process, such as a low pressure CVD (LPCVD), atomic layer CVD (ALCVD), ultrahigh vacuum CVD (UHVCVD), reduced pressure CVD (RPCVD), or any suitable CVD process; (ii) molecular beam epitaxy (MBE) processes; (iii) any suitable epitaxial process; or (iv) a combination thereof.

In some embodiments, first and second semiconductor layers 320 and 322 can include materials similar to (e.g., lattice mismatch within 5%) or different from substrate 106. In some embodiments, each of first and second semiconductor layers 320 and 322 can include silicon or silicon germanium (SiGe) with Ge concentration from about 25 atomic percent to about 50 atomic percent (e.g., about 30 atomic percent, 35 atomic percent, or about 45 atomic percent) with any remaining atomic percent being Si or can include Si without any substantial amount of Ge.

First and/or second semiconductor layers 320 and 322 can be undoped or can be in-situ doped during their epitaxial growth process using (i) p-type dopants, such as boron, indium, or gallium; and/or (ii) n-type dopants, such as phosphorus or arsenic. For p-type in-situ doping, p-type doping precursors, such as diborane ($B_2H_6$), boron trifluoride ($BF_3$), and/or other p-type doping precursors can be used. For n-type in-situ doping, n-type doping precursors, such as phosphine ($PH_3$), arsine ($AsH_3$), and/or other n-type doping precursor can be used. First and second semiconductor layers 320 and 322 can have respective vertical thicknesses 320$t$ and 322$t$ along a z-axis, each ranging from about 6 nm to about 10 nm. Vertical thicknesses 320$t$ and 322$t$ can be substantially equal to or different from each other.

The formation of fin structures 108 can further include etching the structure of FIG. 3A through patterned hard mask layers 440 and 442 (shown in FIGS. 4A-4C) to form fin base portion 108A and stacked fin portion 108B. Hard mask layers 440 and 442 (shown in FIGS. 4A-4C) can be formed on stacked layer 308B of FIG. 3A. In some embodiments, hard mask layer 440 can be a thin film including silicon oxide formed, for example, using a thermal oxidation process. In some embodiments, hard mask layer 442 can be formed of silicon nitride using, for example, LPCVD process or a plasma enhanced CVD (PECVD) process. The etching of the structure of FIG. 3A can include a dry etch, a wet etch process, or a combination thereof; each etch process can separate first and second semiconductor layers 320 and 322 to form third semiconductor layer 420 and channel layer 122. The dry etch process can include using etchants with an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or CHBR3), an iodine-containing gas, other suitable etching gases and/or plasmas, or combinations thereof. The wet etch process can include etching in diluted hydrofluoric acid (DHF), potassium hydroxide (KOH) solution, ammonia, a solution containing hydrofluoric acid (HF), nitric acid ($HNO_3$), acetic acid ($CH_3COOH$), or combinations thereof.

In some embodiments, fin structures 108 can each have a tapered cross-section along a YZ-plane with a horizontal dimension $W_1$ (e.g., fin structures 108's width near substrate 106) of fin base portion 108B along a y-axis being greater than a horizontal dimension $W_2$ (e.g., fin structures 108's width near its top surface 121) of stacked fin portion 108B along a y-axis. Horizontal dimension $W_1$ and $W_2$ can range from about 6 nm to about 20 nm.

Referring to FIG. 2, in operation 210, an isolation structure is formed between each fin structure. For example, as shown in FIG. 7, each of isolation structures 704 (e.g., isolation structures $704_1$-$704_3$) can be formed between adjacent fin structures 108. The formation of isolation structures 704 can include (i) forming a layer 538 of insulating material (shown at FIG. 5) on the structure of FIG. 4A, (ii) forming lower regions $104_L$ over layer 538 of insulating material (shown at FIG. 5), (iii) forming a layer 602 of insulating material over lower regions $104_L$ (shown at FIG. 6), and (iv) recessing layer 538 of insulating material to form the structure of FIG. 7.

Figure 5:
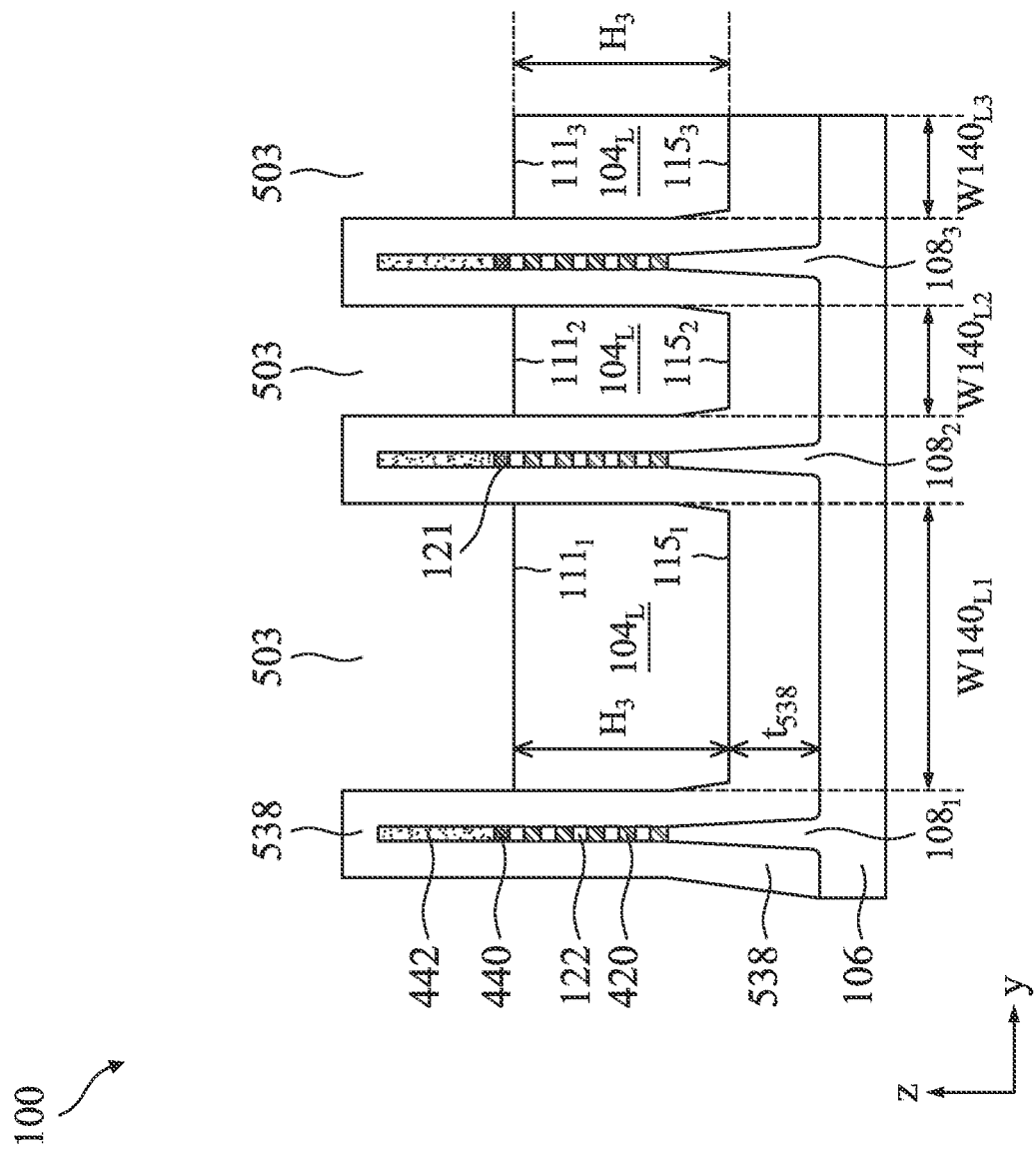
FIGS. 5-16 illustrate cross-sectional views of a semiconductor device at various stages of its fabrication process, according to some embodiments.

Referring to FIG. 5, the formation of layer 538 of insulating material can include depositing one or more layers (not shown in FIG. 5) of insulating material on the structure of FIG. 4A. The one or more layers of insulating material can include one or more layers of protective liners (not shown in FIG. 5) and/or a layer of oxide material or nitride material, such as silicon oxide, silicon nitride, silicon oxynitride, fluoride-doped silicate glass (FSG), or a low-k dielectric material. The one or more layers insulating material for forming layer 538 can be deposited using a suitable process for depositing dielectric materials, such as an ALD process or a CVD process. By way of example and not limitation, the one or more layers of insulating material can be deposited using a high-density-plasma (HDP) CVD process that uses silane ($SiH_4$) and oxygen ($O_2$) as reacting precursors, a sub-atmospheric CVD (SACVD) process that uses tetraethoxysilane (TEOS) and/or ozone ($O_3$), a high aspect-ratio process (HARP) that uses TEOS and/or $O_3$, or a flowable CVD (FCVD) process. In some embodiments, the formation of layer 538 of insulating material can further include can include a wet anneal process. By way of example and not limitation, the wet anneal process can include annealing the deposited one or more layers of insulating material in steam at a temperature from about 200° C. to about 700° C. for a period of time from about 30 min to about 120 min. As shown in FIG. 5, the resulting layer 538 can be conformally formed with recess structures 503 over substrate 106 and fin structures 108. In some embodiments, the resulting recess structures 503 can each have a bottom width substantially identical to bottom width $W104_L$ of isolation structures 104 (e.g., bottom width $W104_{L1}$-$W104_{L3}$ shown at FIGS. 1A and 5). In some embodiments, the resulting layer 538 can have a thickness $t_{538}$ from about 1000 nm to about 2000 nm. In some embodiments, thickness $t_{538}$ can be conformal on the structure of FIG. 5. For example, a portions of layer 538 forming along fin structure 108's sidewalls can have a substantial identical thickness $t_{538}$ as another portions of layer 538 formed over substrate 106. Other materials, formation methods, and dimensions for layer 538 are within the scope and spirit of this disclosure.

The formation of lower regions $104_L$ can include (i) depositing one or more layers of dielectric materials over each recess structure 503, and (ii) etching back the deposited one or more layers of dielectric material. The one or more layers of dielectric material can include a low-k dielectric material and/or a high-k dielectric material, each having different etching selectivity as layer 538. By way of example and not limitation, the one or more layers of dielectric material can include silicon oxide, silicon nitride, silicon oxynitride, silicon carbide (SiC), silicon carbon nitride (SiCN), silicon oxycarbide (SiOC), silicon oxycarbonitride (SiOCN), aluminum oxide, aluminum nitride, aluminum oxynitride (AlON), zirconium oxide (ZrO), zirconium aluminum oxide (ZrAlO), or hafnium oxide. The one or more layers of dielectric material can be deposited using a suitable deposition process, such as a CVD process, an HDP-CVD process, an SACVD process, an ALD process, a HARP, or an FCVD process.

The etch back of the one or more layers of dielectric material can be performed by a dry etching process, a wet etching process, or a combination thereof. Each of the dry etching process and wet etching process can have an etching selectivity of the one or more layers of dielectric materials for lower regions $104_L$ to layer 538 of being from about 5 to about 10. In some embodiments, the dry etch process can include using a plasma dry etch with a gas mixture having octafluorocyclobutane ($C_4F_8$), argon (Ar), $O_2$, and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 mTorr to about 5 mTorr. In some embodiments, the wet etch process can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process can include using ammonia ($NH_3$) and hydrofluoric acid (HF) as etchants and inert gases, such as Ar, xenon (Xe), He, or a combination thereof. In some embodiments, the flow rate of HF and $NH_3$ used in the dry etch process can each range from about 10 sccm to about 100 sccm. In some embodiments, the dry etch process can be performed at a pressure ranging from about 5 mTorr to about 100 mTorr and a high temperature ranging from about 50° C. to about 120° C. After the etch back process, the resulting lower region $104_L$ can each have height $H_3$ between its top surface 111 and its bottom surface 115. In some embodiments, the formation of lower regions $104_L$ can further include by a polishing process, such as a chemical mechanical polishing (CMP) process, to planarize top surfaces of the deposited one or more layers of dielectric material prior to the etch back process.

Figure 6:
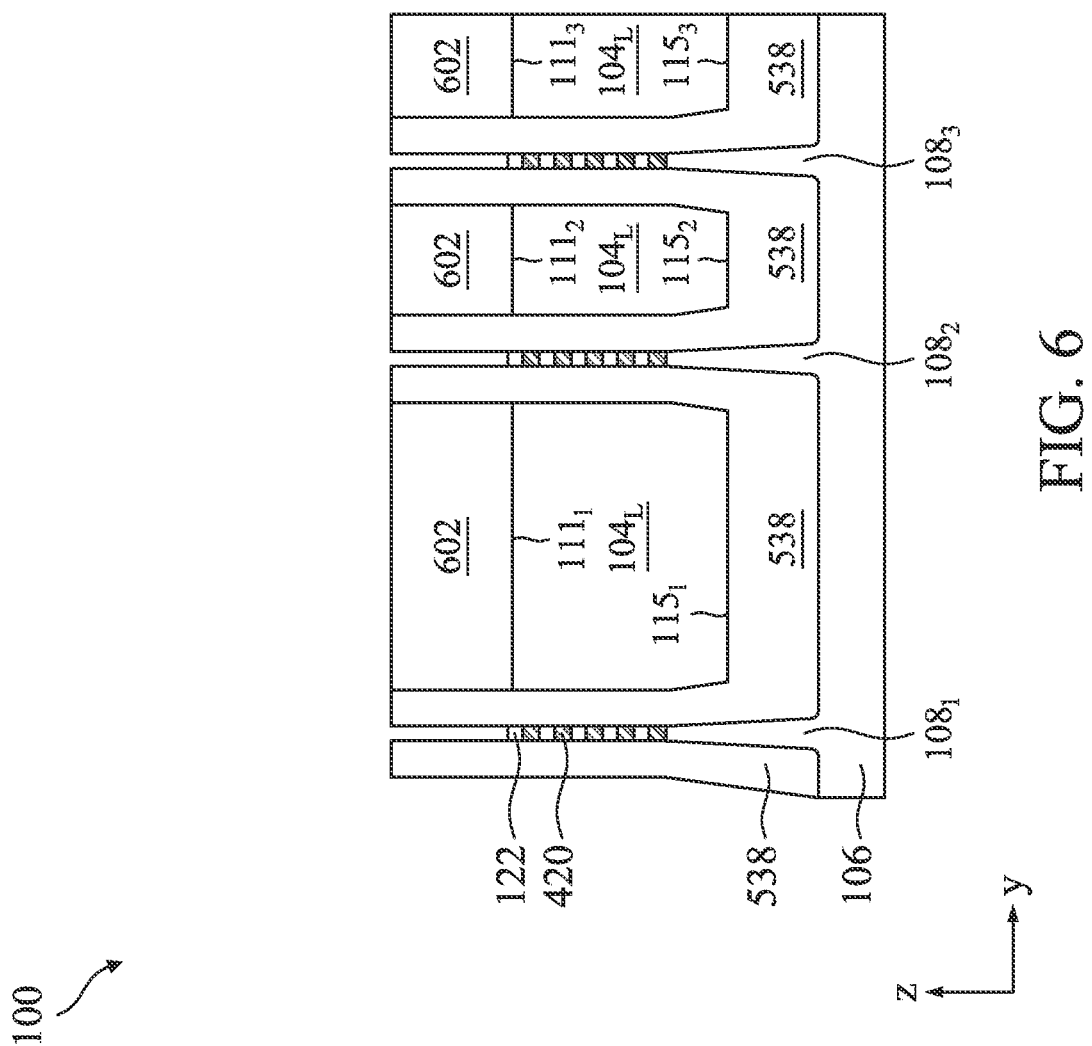
Figure 7:
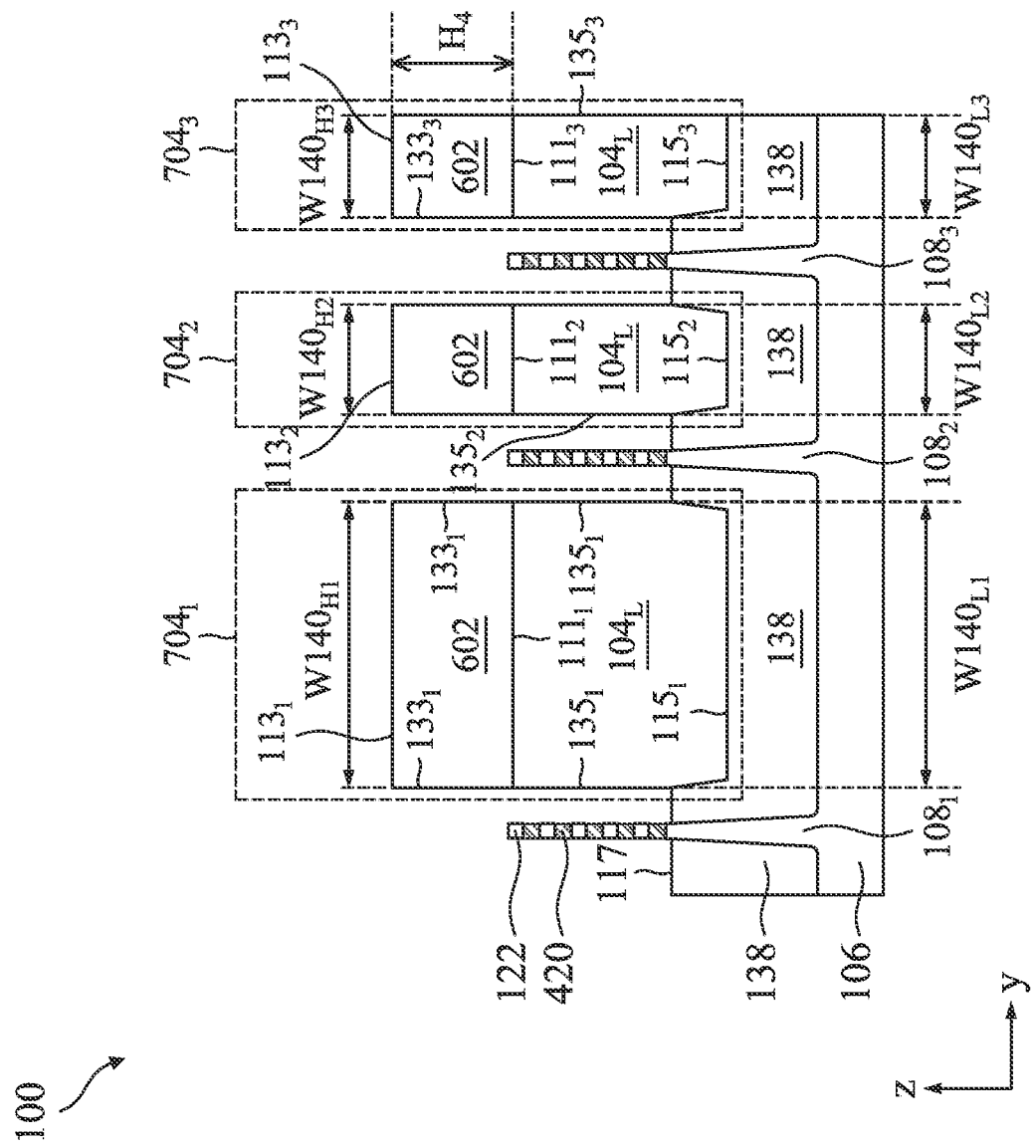

Referring to FIG. 6, the formation of layer 602 can include (i) depositing one or more layers of dielectric materials over the structure of FIG. 5, (ii) polishing the deposited one or more layers of dielectric materials for the formation of layer 602 using, for example, a CMP process, and (iii) removing the patterned hard mask layers 440 and 442. The one or more layers of dielectric material can include a low-k dielectric material and/or a high-k dielectric material, each having different etching selectivity than lower region $104_L$. In some embodiments, the etching selectivity of the one or more layers of dielectric materials of layer 602 to lower region $104_L$ can be equal to or greater than about 5.

By way of example and not limitation, the one or more layers of dielectric material for the formation of layer 602 can include silicon oxide, silicon nitride, silicon oxynitride, silicon carbide (SiC), silicon carbon nitride (SiCN), silicon oxycarbide (SiOC), silicon oxycarbonitride (SiOCN), aluminum oxide, aluminum nitride, aluminum oxynitride (AlON), zirconium oxide (ZrO), zirconium aluminum oxide (ZrAlO), or hafnium oxide. The one or more layers of dielectric material for the formation of layer 602 can be deposited using a suitable deposition process, such as a CVD process, an HDP-CVD process, an SACVD process, an ALD process, HARP, or an FCVD process. The removal of patterned hard mask layers 440 and 442 can performed by a wet etching process or a dry etching process. In some embodiments, each of the wet etching process or the dry etching process for etching hard mask layers 440 and 442 can have different selectivity to fin structures 108.

Referring to FIG. 7, the recessing of layer 538 of insulating material can include performing an etch back process on the polished layer 538. The etch back process for recessing layer 538 can include a dry etching process or a wet etching process, each having an etching selectivity of layer 538 to lower regions $104_L$ and layer 602 of being from about 5 to about 10. In some embodiments, the dry etch process can include using a plasma dry etch with a gas mixture having $C_4F_8$, Ar, $O_2$, $NH_3$, $CHF_3$, He, $CF_4$, $CH_2F_2$, $Cl_2$, or a combination thereof with a pressure ranging from about 1 mTorr to about 5 mTorr. In some embodiments, the wet etch process can include using DHF treatment, APM, SPM, DI water, or a combination thereof. In some embodiments, the dry etch process can be performed at a pressure ranging from about 5 mTorr to about 100 mTorr and a high temperature ranging from about 50° C. to about 120° C. The etching back process can therefore form STI regions 138 having top surface 117 above lower region $104_L$'s bottom surfaces 115 and expose third semiconductor layer 420 and channel layers 122. Further, the etch back process can result in multiple isolation structures 704, where each isolation structure 704 can include layer 602 having exposed top surfaces 113 (e.g., sidewalls $133_1$-$133_3$ shown at FIG. 7) with width $W104_H$ (e.g., top width $W104_{H1}$-$W104_{H3}$ shown at FIGS. 1A and 7) and exposed sidewalls 133 with height $H_4$. The resulting isolation structures 704 can each further include lower region $104_L$ with partially exposed sidewalls 135 (e.g., sidewalls $135_1$-$135_3$ shown at FIG. 7). In some embodiments, the formation of lower regions $104_L$ can further include by a polishing process, such as a chemical mechanical polishing (CMP) process, to planarize top surfaces of the deposited one or more layers of dielectric material prior to the etch back process.

Referring to FIG. 2, in operation 215, multiple sacrificial gate structures and source/drain regions are formed on the multiple fin structures. For example, as shown in FIG. 11, multiple polysilicon structures 812 and S/D regions 110 can be formed on each fin structure 108 as described in reference to FIGS. 8-11. The formation of polysilicon structure 812 and S/D region 110 can include (i) forming one or more polysilicon structures 812 over fin structures 108 (shown in FIG. 8), (ii) forming gate spacers 114 on polysilicon structures 812's sidewalls (shown in FIG. 8), (iii) forming inner spacers 142, each disposed at opposite sides of polysilicon structure 812 and vertically (e.g., in the z-direction) between adjacent channel layers 122 (shown in FIG. 11), (iv) forming S/D regions 110 (shown in FIG. 10), and (v) forming ILD layer 118, and/or ESL 116 over the structure of FIG. 10 (shown in FIG. 11).

Figure 8:
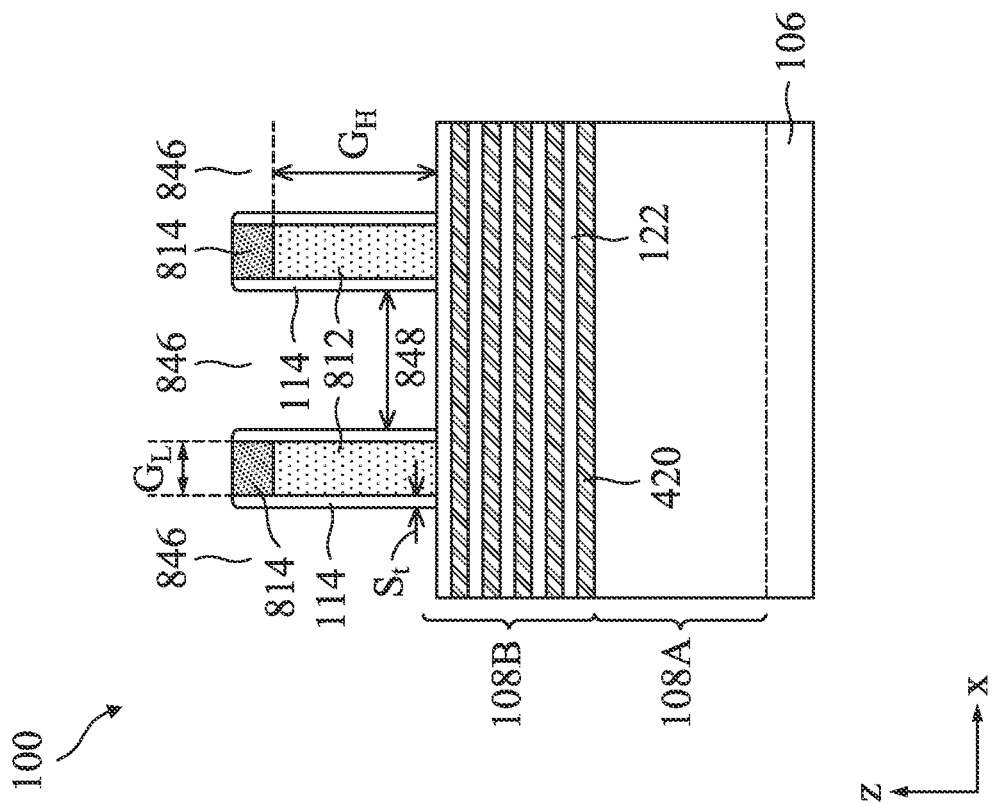

Referring to FIG. 8, the formation of polysilicon structures 812 can include blanket depositing a layer of polysilicon material over fin structures 108 and etching the layer of polysilicon material through a patterned hard mask layer 814 formed on the layer of polysilicon material. In some embodiments, the layer of polysilicon material can be undoped, and hard mask layer 814 can include an oxide layer and/or a nitride layer. The oxide layer can be formed using a thermal oxidation process and the nitride layer can be formed by LPCVD or PECVD. Hard mask layer 814 can protect polysilicon structures 812 from subsequent processing steps (e.g., during formation of gate spacers 114, inner spacers 142, S/D regions 110, ILD layer 118, and/or ESL 116).

The blanket deposition of the layer of polysilicon material can include CVD, PVD, ALD, or other suitable deposition processes. The etching of the deposited layer of polysilicon material can include a dry etch, a wet etching, or a combination thereof to form polysilicon structures, each having horizontal (e.g., in the x-direction) dimension $G_L$ and vertical (e.g., in the z-direction) height $G_H$. In some embodiments, the etching of the deposited layer of polysilicon material to form polysilicon structures 812 can include four etching steps. The first polysilicon etch step can include using a gas mixture having HBr, $O_2$, $CHF_3$, and $Cl_2$. The second polysilicon etch step can include using a gas mixture having HBr, $O_2$, $Cl_2$, and nitrogen ($N_2$) at a pressure of about 45 mTorr to about 60 mTorr. The third polysilicon etch step can include using a gas mixture having HBr, $O_2$, $Cl_2$, $N_2$, and Ar at a pressure of about 45 mTorr to about 60 mTorr. The fourth polysilicon etch step can include using a gas mixture having HBr, $O_2$, $Cl_2$, and $N_2$ at a pressure of about 45 mTorr to about 60 mTorr. The first polysilicon etch step can have a higher polysilicon etch rate than the second, third, and/or fourth polysilicon etch steps. The first polysilicon etch step is used to etch unwanted portions of the blanket deposited layer of polysilicon material above fin structures 108. The second, third, and fourth polysilicon etch steps are used to etch unwanted portions of the blanket deposited layer of polysilicon material within spaces 846 with an aspect ratio, such as greater than about 1:15.

In some embodiments, vertical dimensions $G_H$ of polysilicon structures 812 can be from about 100 nm to about 150 nm. Polysilicon structures 812 can have an aspect ratio equal to or greater than about 9, where the aspect ratio is a ratio of dimension $G_H$ to dimension $G_L$. In some embodiments, horizontal (e.g., in the x-direction) dimensions 848 between adjacent polysilicon structures 812 can be in a range from about 40 nm to about 90 nm. The sum of a value of dimension 848 and a value of dimension $G_L$ is referred to as "one contacted poly pitch (1 CPP)." In some embodiments, horizontal (e.g., in the x-direction) dimension $L_1$ of each fin structure 108 (shown in FIG. 1C) can be at least 3 CPP to prevent the relaxation of strain in fin structures 108, and consequently, prevent the relaxation of strain in channel layers 122 formed in fin regions 108B under gate structures 112.

The formation of gate spacers 114 can include blanket depositing a layer of an insulating material (e.g., an oxide or a nitride material) over substrate 106 by a CVD, a PVD, or an ALD process followed by an etching process (e.g., reactive ion etching or other dry etching process using a chlorine or fluorine based etchant). Spacers 114 can have a horizontal (e.g., in the x-direction) thickness ranging from about 3 nm to about 10 nm, according to some embodiments.

Figure 9:
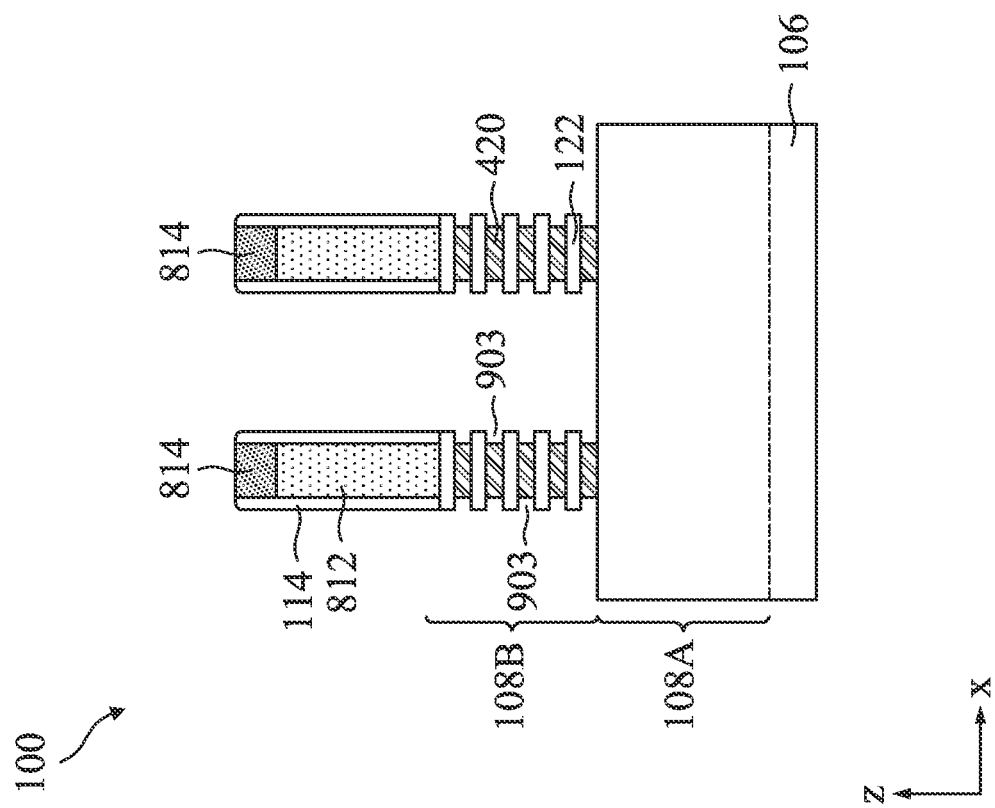
Figure 10:
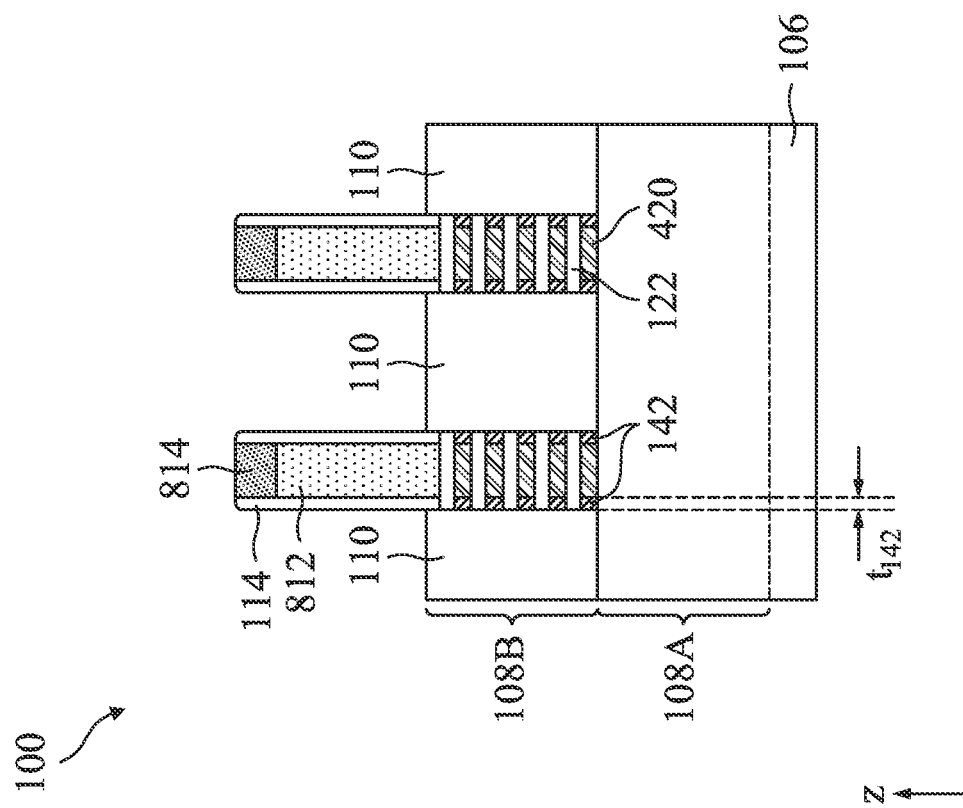
Figure 11:
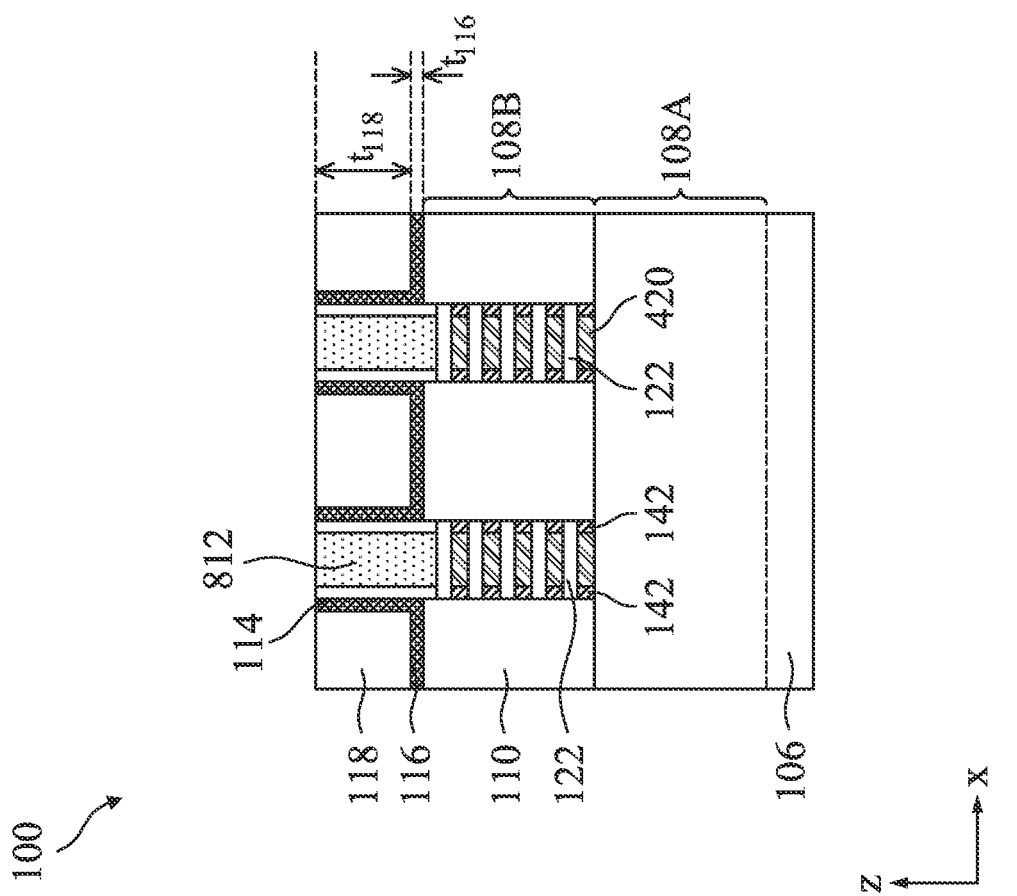

Referring to FIGS. 9 and 10, the formation of inner spacers 142 can include (i) forming recess structures 903 (shown in FIG. 9) at opposite sides of each of third semiconductor layers 420 under polysilicon structures 812, and (ii) filling each recess structures 903 with one or more layers insulating material (shown in FIG. 10). As shown in FIG. 9, a process of forming recess structures 903 can include removing portions of third semiconductor layers 420 via an etch back process using polysilicon structures 812 and gate spacer 114 as hard masks. The etch back process can be an etching process using a dry etch process, a wet etch process, or a combination thereof, each having an etching selectivity of third semiconductor layers 420 to channel layers 122 of being about 10 or greater. By way of example and not limitation, channels layers 122 can be Si layers and third semiconductor layers 420 can be a SiGe layers, where the etch process can be a drying etching process selective towards SiGe. For example, halogen-based chemistries can exhibit etch selectivity higher for Ge and lower for Si. Therefore, halogen gases can etch SiGe faster than Si. Thus, the selective etching process can be designed not to remove channel layers 122 after forming recess structures 903. In some embodiments, the halogen-based chemistries can include fluorine-based and/or chlorine-based gasses. Alternatively, a wet etch chemistry with high selectivity towards SiGe can be used. By way of example and not limitation, the wet etch chemistry can include a mixture of sulfuric acid ($H_2SO_4$) and hydrogen peroxide ($H_2O_2$) (SPM), or APM.

As shown in FIG. 10, the filling of each recess structure 903 can include depositing a blanket film in recess structures 903, and removing portions of the blanket film outside recess structures 903. The processes for forming and removing the blanket film can use similar techniques as forming gate spacer 114. For example, the process of forming the blanket film can include depositing a dielectric material using CVD or ALD. The process of removing the portions of the blanket film can include using a dry etch process, a wet etch process, or a combination thereof. In some embodiments, each inner spacer 142 can have a thickness $t_{142}$ range from about 1 nm to about 9 nm.

S/D regions 110 can be grown over regions of substrate 106 not underlying polysilicon structures 812 and gate spacer 114. For example, S/D regions 110 can be grown over channel layers 122 and/or fin base portion 108A. The formation S/D regions 110 can include an epitaxially-grown semiconductor material having a lattice constant substantially close to (e.g., lattice mismatch within 5%) that of the material of substrate 106. In some embodiments, the epitaxially grown semiconductor material can be the same material as the material of substrate 106, fin base portion 108A, channel layer 122, or third semiconductor layer 420. In some embodiments, the epitaxially-grown semiconductor material can include: (i) a semiconductor material, such as Ge or Si; (ii) a compound semiconductor material, such as GaAs and/or AlGaAs; or (iii) a semiconductor alloy, such as SiGe and/or GaAsP. In some embodiments, S/D regions 110 can be grown by (i) CVD, such as LPCVD, ALCVD, UHVCVD, RPCVD, or any suitable CVD; (ii) MBE process; (iii) any suitable epitaxial process; or (iv) a combination thereof. In some embodiments, S/D regions 110 can be grown by an epitaxial deposition/partial etch process, which can repeat the epitaxial deposition/partial etch process at least once. Such repeated deposition/partial etch process is also called a cyclic deposition-etch (CDE) process.

S/D regions 110 can be both p-type or n-type or one of each conductivity type epitaxial fin regions. In some embodiments, p-type S/D region 110 can include SiGe and can be in-situ doped during an epitaxial growth process using p-type doping precursors such as, but not limited to, $B_2H_6$, $BF_3$, and/or other p-type doping precursors. In some embodiments, n-type S/D region 110 can include Si and can be in-situ doped during an epitaxial growth process using n-type doping precursors such as, but not limited to, $PH_3$, $AsH_3$, and/or other n-type doping precursors. Other materials and dopant concentrations for the plurality of n-type and/or p-type sub-regions are within the scope and spirit of this disclosure.

In some embodiments, the formation of S/D regions 110 can further include etching back portions of stacked fin portion 108B not covered by polysilicon structures 812 and gate spacers 114 prior to the epitaxial growth of S/D region 110. In some embodiments, a biased etching process can be performed to etch back the portions of stacked fin portion 108B outside polysilicon structures 812 and gate spacers 114. By way of example and not limitation, the etching process can be performed under a pressure of about 1 mTorr to about 1000 mTorr, a power of about 50 W to about 1000 W, a bias voltage of about 20 V to about 500 V, at a temperature of about 40° C. to about 60° C., and using HBr and/or $Cl_2$ as etch gases. During the etching process, polysilicon structures 812 can be protected from being etched by hard mask layer 814.

Referring to FIG. 11, the formation of ESL 116 can include blanket depositing a layer of material for ESL 116 on the structure of FIG. 10 any suitable deposition method, such as, PECVD, SACVD, LPCVD, ALD, high-density plasma (HDP), plasma enhanced atomic layer deposition (PEALD), molecular layer deposition (MLD), plasma impulse chemical vapor deposition (PICVD). By way of example and not limitation, the layer of material for ESL 116 can include silicon nitride, silicon oxide, SiON, SiC, SiCN, boron nitride (BN), silicon boron nitride (SiBN), silicon carbide boron nitride (SiCBN), or a combination thereof.

The blanket deposition of the layer of material for ESL 116 can be followed by a blanket deposition of a layer of dielectric material for ILD layer 118. In some embodiments, the dielectric material can be silicon oxide. The layer of dielectric material can be deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using FCVD process. The blanket deposition process can be followed by a thermal annealing of the deposited layer of dielectric material in steam at a temperature ranging from about 200° C. to about 700° C. for a period ranging from about 30 minutes to about 120 minutes.

The thermal annealing can be followed by a CMP process to coplanarize top surfaces of ESL 116, ILD 118, gate spacers 114, and polysilicon structures 812 with each other as shown in FIG. 9A. During the CMP process, hard mask layer 814 can be removed. In some embodiments, ESL 116 can have a thickness $t_{116}$ over S/D regions 110 and gate spacers 114 ranging from about 3 nm to about 30 nm. In some embodiments, ILD layer 118 can have a thickness $t_{118}$ ranging from about 50 nm to about 200 nm.

Figure 12:
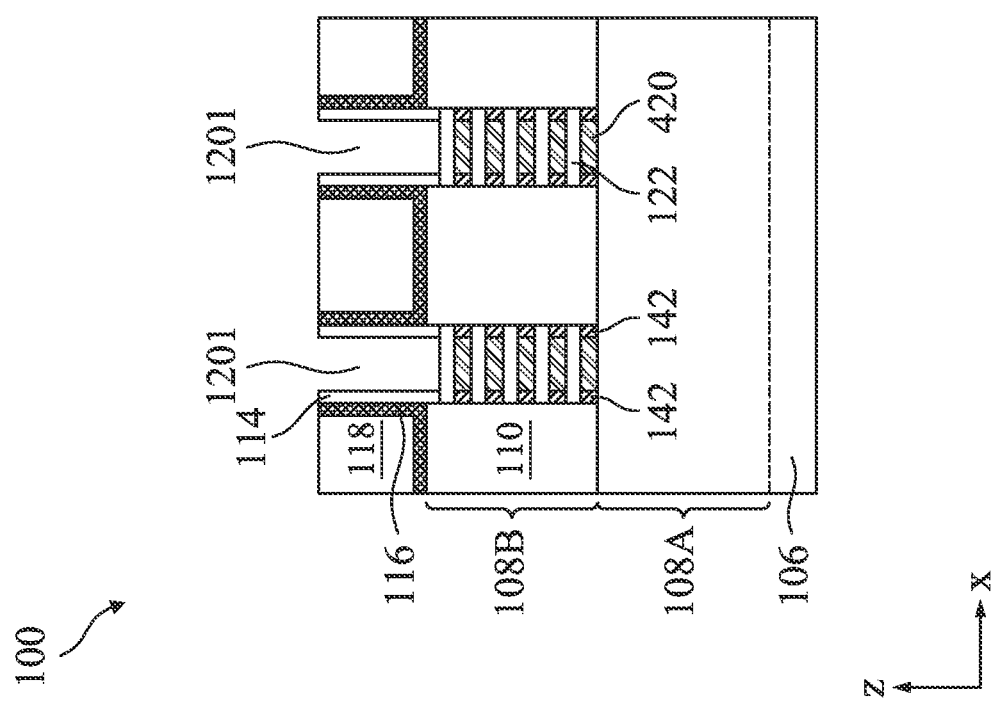
Figure 13:
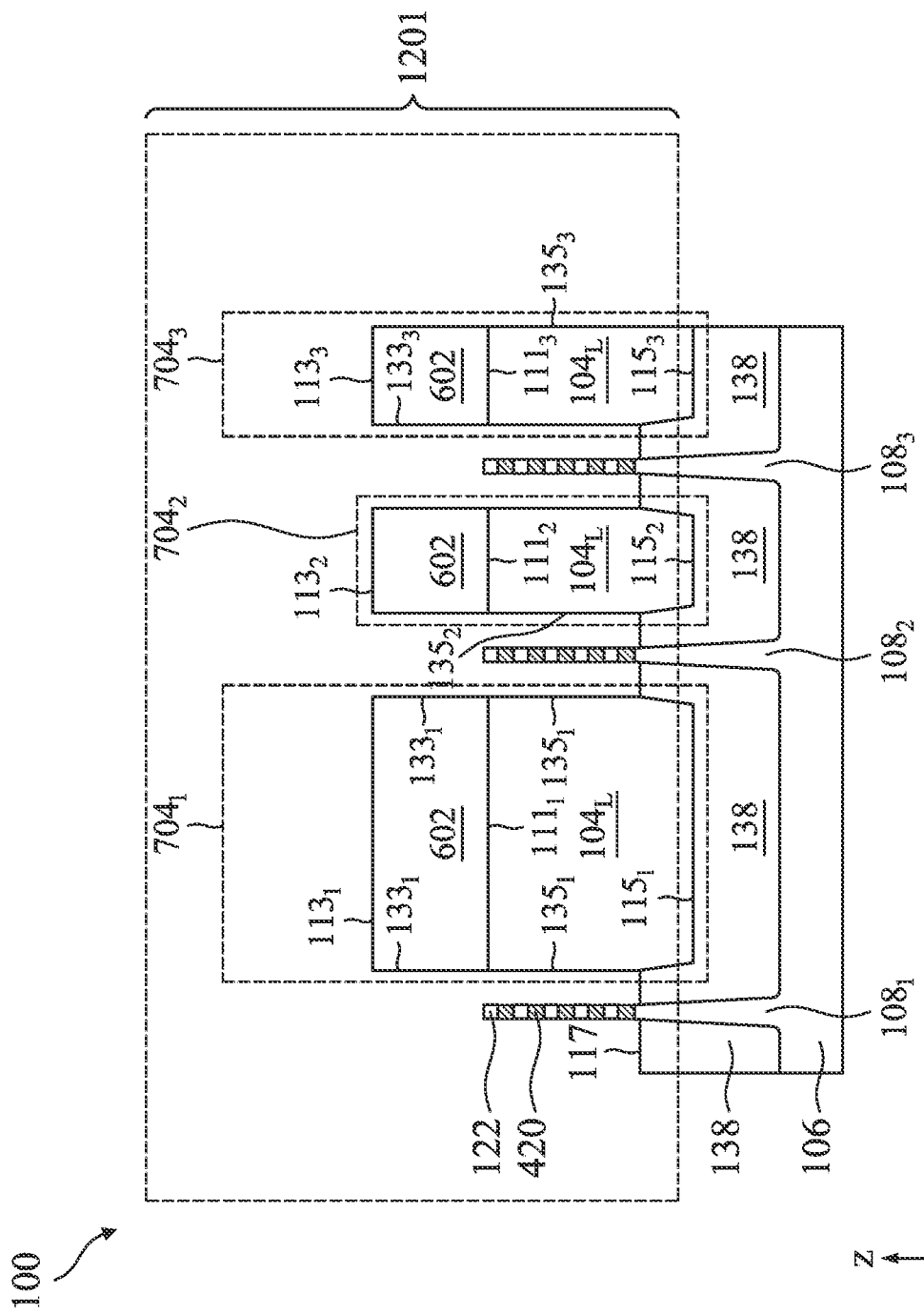

Further, in operation 215, following the formation of ESL 116 and/or ILD layer 118, polysilicon structures 812 can be removed. Referring to FIGS. 12 and 13, a process of forming recess structures 1201 can include removing polysilicon structures 812 via a dry etching process (e.g., reactive ion etching) or a wet etching process, each having a higher etching rate towards polysilicon structures 812 and a lower etching rate (e.g., selectivity greater than 1) towards fin structures 108 and isolation structures 704. In some embodiments, the gas etchants used in the dry etching process can include chlorine, fluorine, bromine, or a combination thereof. In some embodiments, an ammonium hydroxide (NH$_4$OH), sodium hydroxide (NaOH), and/or potassium hydroxide (KOH) wet etch can be used to remove polysilicon structures 812. The removal of polysilicon structures 812 can therefore expose side surfaces of gate spacer 114 and portions of fin structures 108 and isolation structures 704 under polysilicon structures 812.

Referring to FIG. 2, in operation 220, footing regions are formed for one or more of the isolation structures. For example, as shown in FIG. 16, footing regions 158$_L$ and 158$_R$ are formed on isolation structure 104$_1$ as described in reference to FIGS. 14-16. The formation of footing structures 158 (e.g., footing regions 158$_L$ and 158$_R$) can include (i) masking one or more isolation structures 704 with a sacrificial stack (shown in FIG. 14), and (ii) removing isolation structures 704 defined by the sacrificial stack (shown in FIGS. 15 and 16).

Figure 14:
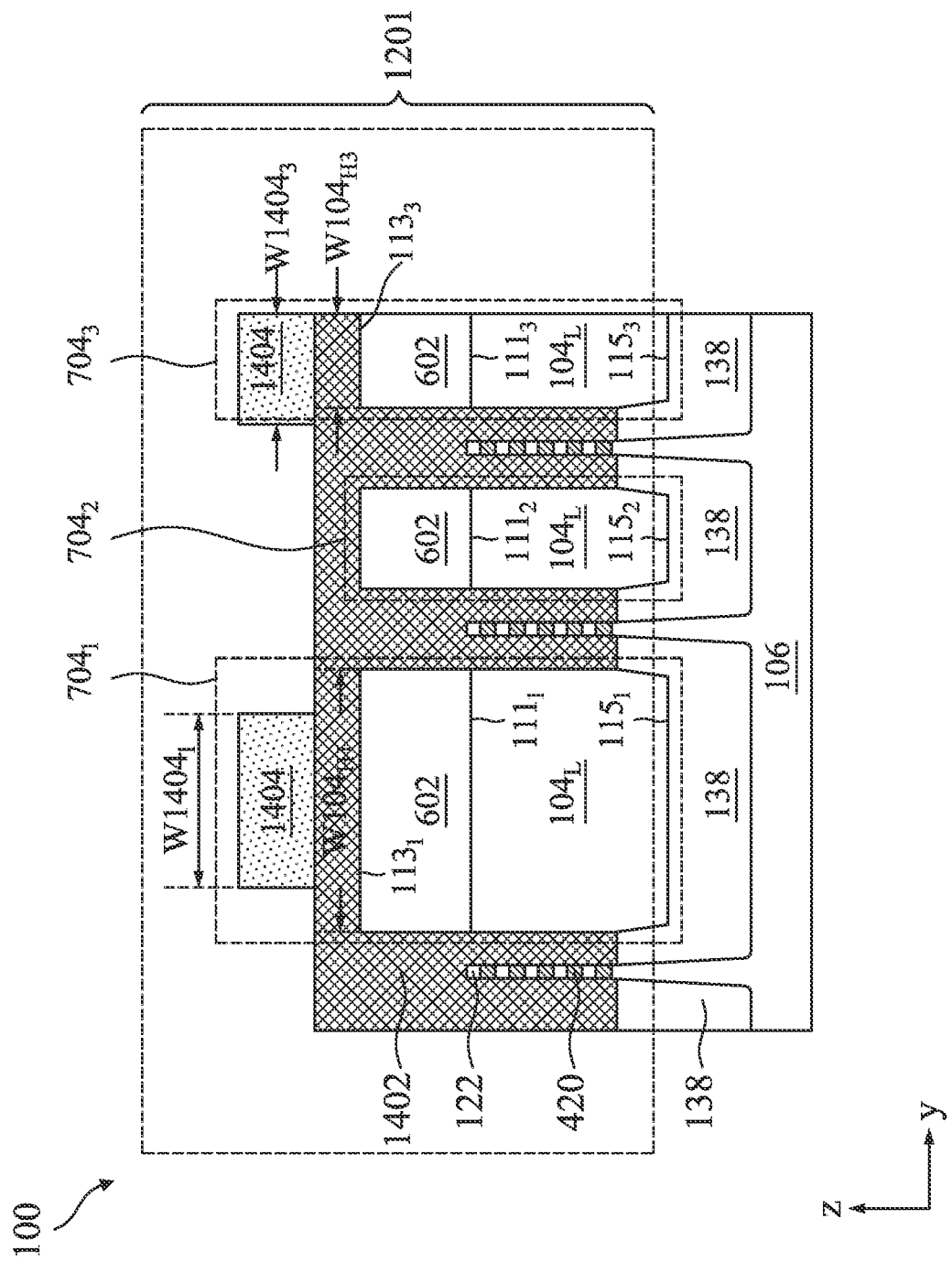

Referring to FIG. 14, the process of masking one or more isolation structures 704 can include forming a mask layer 1404 over at least one isolation structures 704 (e.g., isolation structures 704$_1$ and 704$_3$) using photolithography. In some embodiments, the process of masking one or more isolation structures 704 can further include forming a sacrificial layer 1402 between mask layer 1404 and the structure of FIG. 13. By way of example and not limitation, the process of forming sacrificial layer 1402 can include blanket spin-coating an organic material, such as a polymer material, a blanket deposition of a dielectric material, or the combination of both. By way of example and not limitation, mask layer 1404 can include a photosensitive material, such as a photoresist. In some embodiments, mask layer 1404 can be selectively patterned over the group of isolation structures 704 (e.g., isolation structures 704$_1$ and 704$_3$), while opening the other group of isolation structures 704 (e.g., isolation structures 704$_2$). In some embodiments, mask layer 1404 can be selectively patterned over the a first group of isolation structures 704 (e.g., isolation structures 704$_1$) and a second group of isolation structures 704 (e.g., isolation structures 704$_3$), where (i) a horizontal (in the y-direction) width of patterned mask layer 1404 on the first group of isolation structure 704 can be less than a horizontal (e.g., in the y-direction) top width of the first group of isolation structure 704, and (ii) a horizontal (in the y-direction) width of patterned mask layer 1404 on the second group of isolation structure 704 can be greater than a horizontal (e.g., in the y-direction) top width of the second group of isolation structure 704. For example, as shown in FIG. 15, mask layer 1404 can be respectively patterned with a width W1404$_1$ and W1404$_3$ on isolation structures 704$_1$ and 704$_3$, where W1404$_1$ and W1404$_3$ can be respectively less than and greater than isolation structure 704$_1$'s top width W104$_{H1}$ and isolation structure 704$_3$'s top width W104$_{H3}$.

Figure 15:
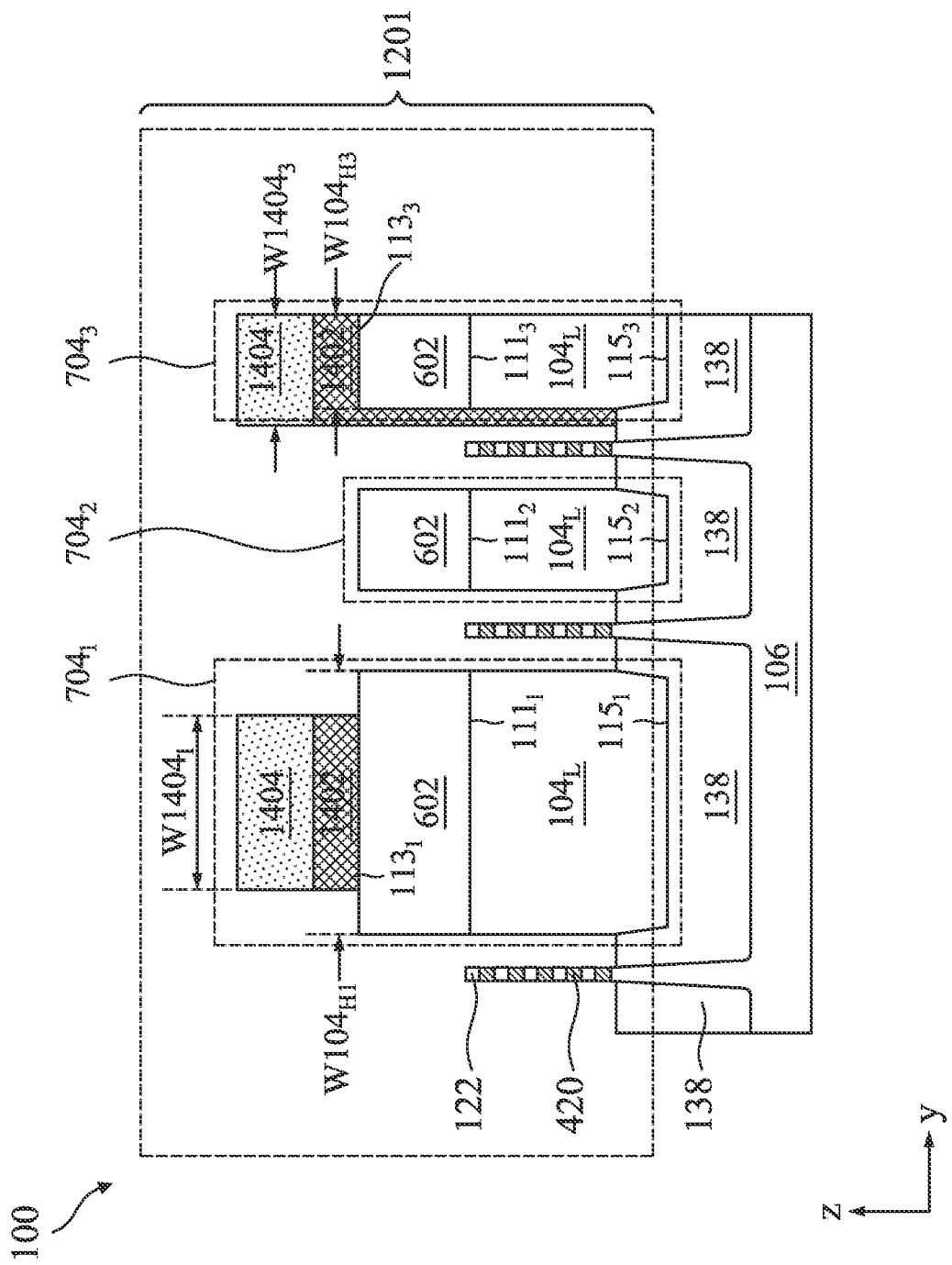
Figure 16:
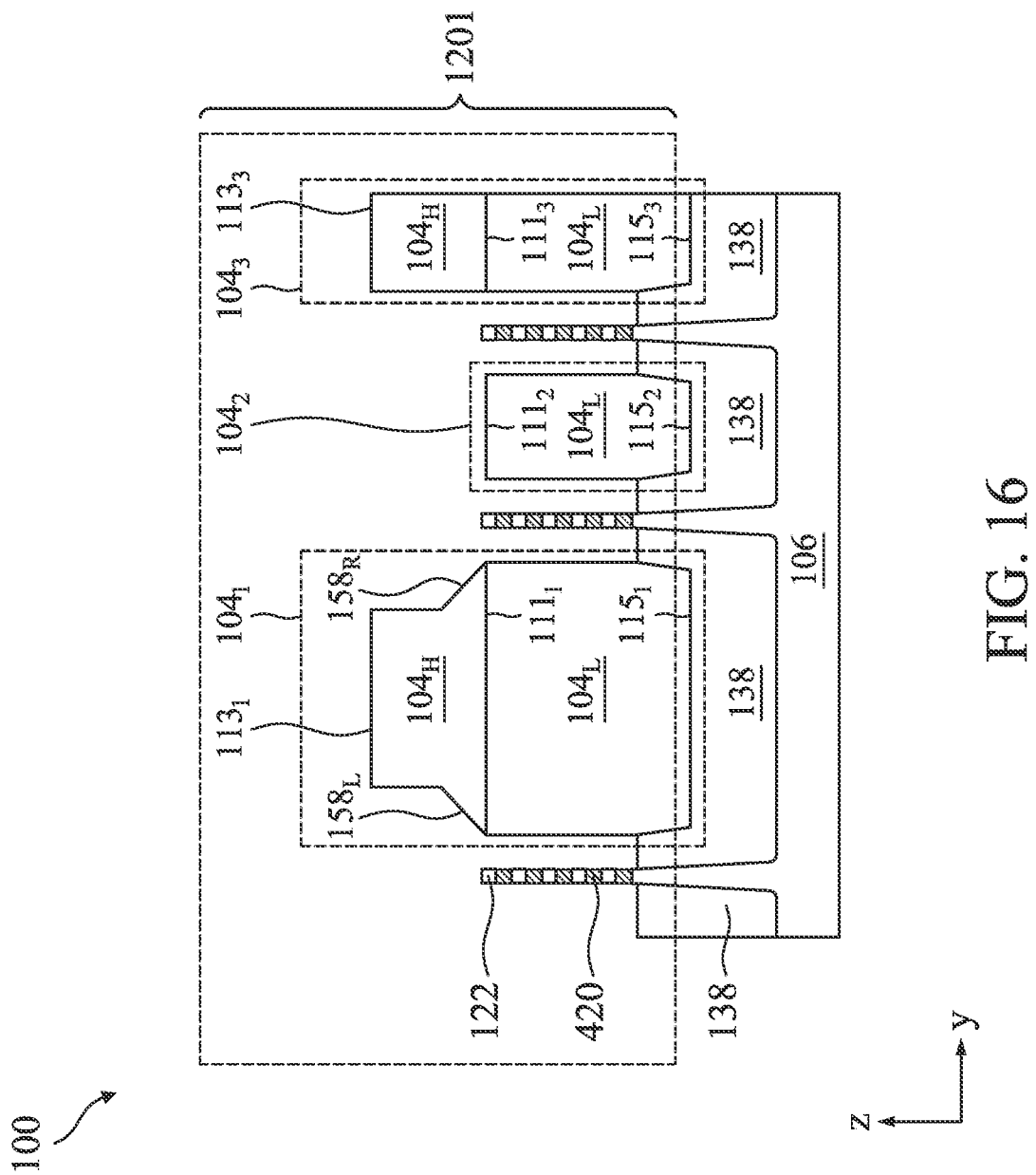

Referring to FIGS. 15 and 16, the process of removing isolation structures 704 can include etching isolation structures 704 through mask layer 1404 to form isolation structures 104. In some embodiments, the process of removing isolation structures 704 can additionally include etching sacrificial layer 1402 through mask layer 1404, where the process of removing isolation structures 704 can further include etching of isolation structures 704 through the stack of etched sacrificial 1402 and mask layer 1404. The etching of isolation structures 704 can include a dry etching process that can selectively etch each isolation structure 704's layer 602 from the underlying lower region 104$_L$. As a result, the dry etching process can etch a first isolation structure 704 (e.g., isolation structure 704$_1$) covered by a narrower mask layer 1404 to form a first isolation structure 104 (e.g., isolation structure 104$_1$) with upper region 104$_H$ having footing region structure 158. In some embodiments, the dry etching process can concurrently etch second isolation structures 704$_2$ opened by mask layer 1404 to form a second isolation structure 104 (e.g., isolation structure 104$_2$) that exposes surface (e.g., top surface 111$_2$) of lower region 104$_L$ (e.g., isolation structure 704$_2$'s layer 602 is removed by the dry etching process). In some embodiments, the dry etching process can concurrently etch a third isolation structures 704 (e.g., isolation structure 704$_3$) covered by wider mask layer 1404 to form a third isolation structure 104 (e.g., isolation structure 104$_3$) that includes lower region 104$_L$ and upper region 104$_H$, both having a substantially vertical (e.g., in the z-direction) sidewalls (e.g., sidewalls 133$_3$ and 135$_3$) coplanar with each other along a z-axis (e.g., isolation structure 104$_3$ does not have footing regions 158). By way of example and not limitation, the dry etching process can include a plasma dry etch with a gas mixture using molecules containing bromine and/or chlorine to form footing region 158, because such gas mixture can be functioned as a deposition gas to adjust the dry etching's directionality. In some embodiments, the dry etching process can include a plasma dry etch associated with the flow rate of chlorine (Cl$_2$) and hydrogen bromide, each ranging from about 100 sccm to about 300 sccm to form footing region 158. In some embodiments, the dry etching process can include a plasma dry etch associated a pressure ranging from about 50 mTorr to about 300 mTorr to form footing region 158. In some embodiments, the dry etching process can include a plasma dry etch associated a temperature ranging from about 25° C. to about 200° C. to form footing region 158, because of the trade-off between the etching rate and the thermal budget of channel layers 122.

Figures 18A, 18B:
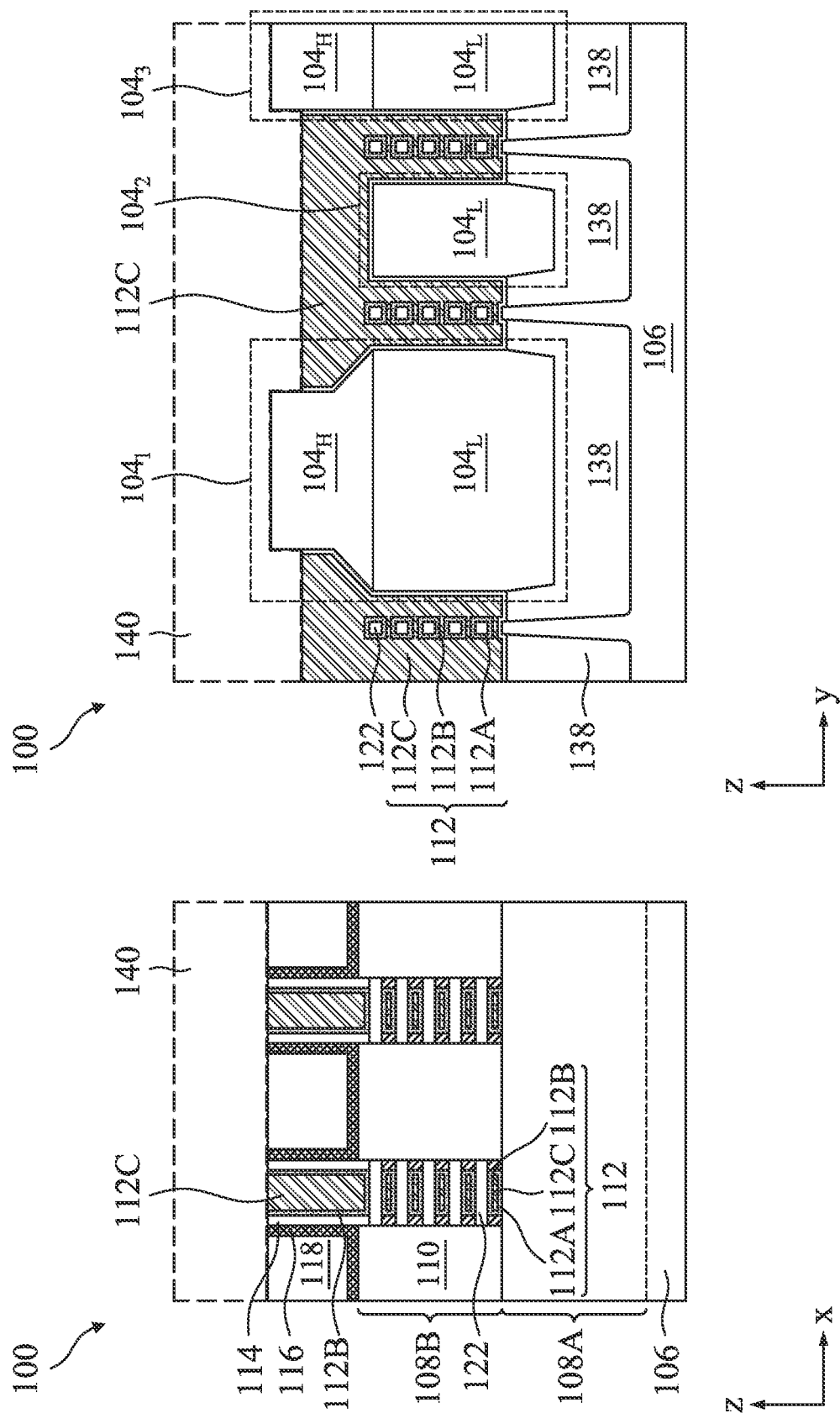

Referring to FIG. 2, in operation 225, one or more metal gate structures are formed on the multiple fin structures and the isolation structures. For example, as shown in FIGS. 18A and 18B, gate structures 112 are formed wrapped around channel layers 122 of stacked fin portion 108B of fin structures 108 as described with reference to FIGS. 17A-17B and 18A-18B. The formation of gate structures 112 can include (i) performing an oxidation process to form oxide layer 112A on surfaces of channel layers 122 of stacked fin portion 108B in each recess structure 1201 in the structure of FIG. 16A, (ii) selective removal of third semiconductor layers 420 using from channel layer 122 using a wet etch process, (iii) depositing dielectric material for gate dielectric layers 112B (shown in FIGS. 17A and 17B), and (iv) depositing conductive material for gate electrode 1712 (shown in FIGS. 17A and 17B). In some embodiments, the formation of gate structure 112 can further include recessing gate electrode 1712 to form gate electrode 112C (shown in FIGS. 18A and 18B).

The oxidation process for forming oxide layer 112A can include a thermal oxidation or an ozone based oxidation process performed at a temperature from about 400° C. to about 600° C. for a period from about 2 min to about 4 hrs. Oxide layer 112A can be grown to protect channel layers 122 during the selective removal of third semiconductor layers 420 of stacked fin portion 108B in each recess structure 1201. Another oxide layer (not shown) of negligible thickness can be concurrently grown on third semiconductor layers 420 during the oxidation process. Nevertheless, such oxide layer grown on third semiconductor layers 420 can have a negligible thickness as an oxidation rate associated with the channel layers 122 can be higher than that associated with third semiconductor layers 420.

Gate dielectric layers 112B can include a single layer of insulating material or a stack of insulating materials. In some embodiments, the layer of dielectric material for gate dielectric layers 112B can include (i) a low-k dielectric material, such as silicon oxide, silicon nitride, and silicon oxynitride, (ii) a high-k dielectric material such as, aluminum oxide, hafnium oxide ($HfO_2$), $TiO_2$, HfZrO, $Ta_2O_3$, $HfSiO_4$, $ZrO_2$, or $ZrSiO_2$, (iii) a high-k dielectric material having oxides of lithium (Li), beryllium (Be), magnesium (Mg), calcium (Ca), strontium (Sr), scandium (Sc), yttrium (Y), Zr, Al, lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. In some embodiments, gate dielectric layers 112B can be deposited by CVD, ALD, PVD, e-beam evaporation, or other suitable processes. In some embodiments, the process of depositing the material of gate dielectric layers 112B can form conformal gate dielectric layers 112B over each recess structure 1201 to wrap around each channel layer 122.

Gate electrode 1712 can include a single metal layer or a stack of metal layers. In some embodiments, gate electrode 1712 can include a suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate electrode 1712 can be formed by ALD, PVD, CVD, or other suitable deposition process. In some embodiments, the process of depositing the material of gate electrode 1712 can form conformal gate electrode 1712 over each recess structure 1201 to wrap around each channel layer 122.

The process of recessing gate electrode 1712 can include planarizing the deposited gate electrode 1712 to form gate electrode 112C via a polishing process (e.g., CMP). In some embodiments, the polishing process can coplanarize top surfaces of gate electrode 112C with top surfaces of ILD layers 118. In some embodiments, as shown in FIGS. 18A and 18B, the process of recessing gate electrode 1712 can further include etching back gate electrode 112C to a level below isolation structures 104's topmost surfaces (e.g., top surface $113_1$ and $113_3$) using any suitable dry etching process and/or any suitable wet etching process that etch both gate dielectric layers 112B and gate electrode 112C.

Further, in operation 225, an interconnect structure can be formed over gate structures 112 and S/D region 110. For example, as shown in FIGS. 18A and 18B, interconnect structure 140 can be formed over gate structures 110 and S/D region 110. By way of example and not limitation, the process of forming the interconnect structure 140 can include depositing MEOL insulating layer 174 (shown in FIGS. 1D-1F) over gate structures 112 and S/D contact structures 224, forming a multiple trench openings within MEOL insulating layer 174 to expose a portion of gate electrode 112C and a portion of S/D region 110, and forming trench conductor 178 into the trench openings and in contact with gate electrode 112C and/or S/D region 110.

The present disclosures provides an exemplary isolation structure with footings and a method for forming the same. The isolation structure can electrically isolate gate structures between different fin structures. In some embodiments, the isolation structure can include an upper region and a lower region. The upper and lower regions can include materials having different etching selectivity with each other. In some embodiments, the upper region includes the footing disposed over the lower region. The upper region with the footing can have a top width narrower than a bottom width of the lower region. A benefit of the footing, among others, is to provide a narrow isolation structure's top width and a wide isolation structure's bottom width respectively for a compact and robust CMG scheme for high density integrated circuits.

In some embodiments, a semiconductor structure can include a substrate, a first vertical structure and a second vertical structure formed over the substrate, and an isolation structure between the first and second vertical structures. The isolation structure can include a center region and footing regions formed on opposite sides of the center region. Each of the footing regions can be tapered towards the center region from a first end of the each footing region to a second end of the each footing region.

In some embodiments, a field effect transistor (FET) structure can include a substrate, a first vertical structure and a second vertical structure formed over the substrate, a gate structure disposed over portions of the first and second vertical structures, and an isolation structure disposed between the first and second vertical structures. Each of the first and second vertical structures can include a channel layer. The isolation structure can include a first sidewall, a second sidewall, and a footing region vertically between the first sidewall and the second sidewall. The first and the second sidewalls can be between a top surface and a bottom surface of the isolation structure. The footing region can be tapered from the second sidewall to the first sidewall.

In some embodiments, a method for forming a semiconductor structure can include forming a first fin structure and a second fin structure over a substrate, forming an isolation structure laterally between the first and second fin structures, and removing a portion of the isolation structure to form a footing region tapering from a sidewall of the isolation structure to a top surface of the isolation structure. The isolation structure can include a first insulating layer and a second insulating layer disposed over the first insulating layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first fin structure and a second fin structure on a substrate;
   forming an isolation layer over the first and second fin structures;
   forming a first insulating layer and a second insulating layer on the isolation layer and between the first and second fin structures; and
   removing a portion of the isolation layer such that top surfaces of the isolation layer and the first insulating layer are below a bottom surface of the second insulating layer, wherein a bottom portion of the first insulating layer is embedded in a remaining portion of the isolation layer.

2. The method of claim 1, wherein forming the isolation layer comprises:

depositing a liner and a dielectric layer, wherein the dielectric layer comprises one or more of an oxide material, a nitride material, and combinations thereof; and performing a wet anneal process by annealing the liner and the dielectric layer in steam at a temperature between about 200° C. and about 700° C. for a period of time between about 30 min and about 120 min.

3. The method of claim 1, wherein forming the first insulating layer comprises:

depositing one or more layers of a low-k dielectric material, a high-k dielectric material, and combinations thereof; and etching back a portion of the one or more layers to form the first insulating layer, wherein the top surface of the first insulating layer is substantially coplanar with a top surface of each of the first and second fin structures.

4. The method of claim 1, wherein forming the second insulating layer comprises:

depositing one or more dielectric layers; and polishing the one or more dielectric layers to form the second insulating layer, wherein a top surface of the second insulating layer is substantially coplanar with the top surface of the isolation layer.

5. The method of claim 1, further comprising:

forming one or more hard mask layers on each of the first and second fin structures; and removing the one or more hard mask layers.

6. The method of claim 1, wherein removing the portion of the isolation layer comprises etching the portion of the isolation layer at an etching rate between about 5 times and about 10 times greater than that of etching the first and second insulating layers.

7. The method of claim 1, further comprising:

forming an organic mask layer and a photoresist mask layer on the second insulating layer; and removing a portion of the second insulating layer exposed outside the organic mask layer and the photoresist mask layer to form a tapered region of the second insulating layer.

8. The method of claim 7, wherein forming the organic mask layer comprises:

spin coating a polymer material over the second insulating layer, the remaining portion of the isolation layer, and the first and second fin structures; and removing a portion of the polymer material exposed outside the photoresist mask layer.

9. The method of claim 1, further comprising forming a first portion and a second portion of a gate structure, wherein the first and second insulating layers are interposed between the first and second portions of the gate structure.

10. The method of claim 1, further comprising forming a first portion and a second portion of a gate structure, wherein a top surface of the second insulating layer is above a top surface of each of the first and second portions of the gate structure.

11. A method, comprising:

forming a shallow trench isolation (STI) structure to separate a first fin structure and a second fin structure disposed on a substrate;

forming an isolation structure between the first and second fin structures, wherein the isolation structure comprises a first insulating layer and a second insulating layer, and wherein a bottom portion of the first insulating layer is embedded in the STI structure; and forming a first portion and a second portion of a gate structure, wherein the isolation structure is interposed between the first and second portions of the gate structure and a top surface of the isolation structure is above top surfaces of the first and second portions of the gate structure.

12. The method of claim 11, wherein forming the STI structure comprises:

depositing a dielectric layer over the first and second fin structures, wherein the dielectric layer comprises one or more of an oxide material, a nitride material, and combinations thereof;

performing a wet anneal process by annealing the dielectric layer in steam at a temperature between about 200° C. and about 700° C. for a period of time between about 30 min and about 120 min; and removing a portion of the dielectric layer.

13. The method of claim 12, wherein removing the portion of the dielectric layer comprises etching the portion of the dielectric layer at an etching rate between about 5 times and about 10 times greater than that of etching the first and second insulating layers.

14. The method of claim 11, wherein forming the isolation structure comprises:

depositing one or more layers of a low-k dielectric material, a high-k dielectric material, and combinations thereof; and etching back a portion of the one or more layers to form the first insulating layer, wherein a top surface of the first insulating layer is substantially coplanar with a top surface of each of the first and second fin structures.

15. The method of claim 11, further comprising:

forming an other isolation structure comprising a third insulating layer and a fourth insulating layer;

removing a portion of the second insulating layer to form a tapered region of the second insulating layer; and removing the fourth insulating layer.

16. The method of claim 15, further comprising:

spin coating a polymer material over the second and fourth insulating layers, the STI structure, and the first and second fin structures;

forming a photoresist mask layer on the polymer material spin coated over the second insulating layer; and removing a portion of the polymer material exposed outside the photoresist mask layer.

17. A method, comprising:

forming first and second fin structures on a substrate;

depositing an isolation layer on the substrate and the first and second fin structures;

forming an isolation structure on the isolation layer and between the first and second fin structures, wherein a top surface of the isolation structure is above top surfaces of the first and second fin structures; and removing a portion of the isolation layer on the first and second fin structures to form a shallow trench isolation (STI) structure, wherein a top surface of the STI structure is above a bottom surface of the isolation structure.

18. The method of claim 17, wherein forming the isolation structure comprises:

forming a first insulating layer on the isolation layer between the first and second fin structures; and forming a second insulating layer on the first insulating layer.

19. The method of claim 17, wherein removing the portion of the isolation layer comprises etching the portion of the isolation layer at an etching rate greater than that of etching the isolation structure.

20. The method of claim 17, further comprising forming a gate structure on the first and second fin structures, wherein:
- the gate structure includes a first portion on the first fin structure and a second portion on the second fin structure;
- the isolation structure electrically isolates the first portion and the second portion of the gate structure; and
- the top surface of the isolation structure is above a top surface of each of the first and second portions of the gate structure.

* * * * *